US009579892B2

(12) United States Patent
Yoda

(10) Patent No.: US 9,579,892 B2
(45) Date of Patent: Feb. 28, 2017

(54) WIRING STRUCTURE, METHOD OF MANUFACTURING WIRING STRUCTURE, LIQUID DROPLET EJECTING HEAD, AND LIQUID DROPLET EJECTING APPARATUS

(71) Applicant: SEIKO EPSON CORPORATION, Tokyo (JP)

(72) Inventor: Tsuyoshi Yoda, Matsumoto (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/442,061

(22) PCT Filed: Feb. 24, 2014

(86) PCT No.: PCT/JP2014/000962
§ 371 (c)(1),
(2) Date: May 11, 2015

(87) PCT Pub. No.: WO2014/132615
PCT Pub. Date: Sep. 4, 2014

(65) Prior Publication Data
US 2015/0343769 A1 Dec. 3, 2015

(30) Foreign Application Priority Data
Feb. 26, 2013 (JP) ................. 2013-035506

(51) Int. Cl.
B41J 2/14 (2006.01)
H05K 3/10 (2006.01)
(Continued)

(52) U.S. Cl.
CPC ........... B41J 2/1433 (2013.01); B41J 2/14233 (2013.01); B41J 2/161 (2013.01);
(Continued)

(58) Field of Classification Search
CPC ....... B41J 2/1433; B41J 2/1646; B41J 2/1643; B41J 2/14233; B41J 2/1631; B41J 2/1623; B41J 2/161; B41J 2/1629; B41J 2002/14491; B41J 2002/14241; H05K 1/11; H05K 3/10; H05K 1/0284; H05K 1/0306; H05K 2201/09036; Y10T 29/4913
See application file for complete search history.

(56) References Cited

U.S. PATENT DOCUMENTS

2003/0218238 A1* 11/2003 Kikuchi ................. H01L 23/66
257/678
2005/0116620 A1* 6/2005 Kobayashi .......... H01L 51/5271
313/503
(Continued)

FOREIGN PATENT DOCUMENTS

EP 1700701 A2 9/2006
JP H05-74989 A 3/1993
(Continued)

Primary Examiner — Bradley Thies
(74) Attorney, Agent, or Firm — Harness, Dickey & Pierce, P.L.C.

(57) ABSTRACT

A liquid droplet ejecting head includes a vibrating plate on which a first terminal group having first and second terminals and a second terminal group having third and fourth terminals are formed, a reservoir forming substrate which has a first wiring forming portion having first and second inclined surfaces and a second wiring forming portion having third and fourth inclined surfaces, a first wiring which is formed on the first inclined surface and is electrically connected to the first terminal, a second wiring which is formed on the second inclined surface and is electrically connected to the second terminal, a third wiring which is formed on the third inclined surface and is electrically connected to the third terminal, and a fourth wiring which is formed on the fourth inclined surface and is electrically connected to the fourth terminal.

10 Claims, 15 Drawing Sheets

(51) Int. Cl.
*H05K 1/11* (2006.01)
*B41J 2/16* (2006.01)
*H05K 1/02* (2006.01)
*H05K 1/03* (2006.01)

(52) U.S. Cl.
CPC .......... *B41J 2/1623* (2013.01); *B41J 2/1629* (2013.01); *B41J 2/1631* (2013.01); *B41J 2/1643* (2013.01); *B41J 2/1646* (2013.01); *H05K 1/0284* (2013.01); *H05K 1/0306* (2013.01); *H05K 1/11* (2013.01); *H05K 3/10* (2013.01); *B41J 2002/14241* (2013.01); *B41J 2002/14491* (2013.01); *H05K 2201/09036* (2013.01); *Y10T 29/4913* (2015.01)

(56) References Cited

U.S. PATENT DOCUMENTS

| | | |
|---|---|---|
| 2005/0250306 A1 | 11/2005 | Akagawa et al. |
| 2006/0164466 A1 | 7/2006 | Mizuno et al. |
| 2006/0164468 A1 | 7/2006 | Yoda |
| 2006/0234534 A1 | 10/2006 | Sato |
| 2007/0042613 A1 | 2/2007 | Yoda |
| 2008/0079780 A1 | 4/2008 | Xiao |
| 2012/0050413 A1* | 3/2012 | Miyazawa ............. B41J 2/1623 347/68 |

FOREIGN PATENT DOCUMENTS

| | | | |
|---|---|---|---|
| JP | 07-025010 A | | 1/1995 |
| JP | 07-235621 A | | 9/1995 |
| JP | H10-229144 A | | 8/1998 |
| JP | 2001-189414 A | | 7/2001 |
| JP | 2001189414 A | * | 7/2001 |
| JP | 2002-184942 A | | 6/2002 |
| JP | 2003-318317 A | | 11/2003 |
| JP | 2006-159492 A | | 6/2006 |
| JP | 2006-279016 A | | 10/2006 |
| JP | 2006-281763 A | | 10/2006 |
| JP | 2007-050638 A | | 3/2007 |
| JP | 2007-050639 A | | 3/2007 |
| JP | 3956955 B2 | | 8/2007 |
| JP | 2007-290232 A | | 11/2007 |
| JP | 2009-269314 A | | 11/2009 |
| JP | 4492520 B2 | | 6/2010 |
| JP | 4581664 B2 | | 11/2010 |
| JP | 2011-071417 A | | 4/2011 |
| JP | 4737502 B2 | | 8/2011 |
| JP | 2011-249481 A | | 12/2011 |

* cited by examiner

WIRING STRUCTURE, METHOD OF MANUFACTURING WIRING STRUCTURE, LIQUID DROPLET EJECTING HEAD, AND LIQUID DROPLET EJECTING APPARATUS

TECHNICAL FIELD

The present invention relates to a wiring structure, a method of manufacturing a wiring structure, a liquid droplet ejecting head, and a liquid droplet ejecting apparatus.

BACKGROUND ART

A liquid droplet ejecting apparatus which includes a liquid droplet ejecting head ejecting liquid droplets is used for, for example, image formation or manufacturing of wiring of a micro device.

For example, a piezoelectric driving liquid droplet ejecting head includes a reservoir which stores ink, a plurality of pressure generation chambers which communicate with the reservoir, a plurality of nozzles which respectively communicate with the plurality of pressure generation chambers, a plurality of piezoelectric elements which respectively change pressure in the plurality of pressure generation chambers, and a driver IC which drives the plurality of piezoelectric elements.

In this liquid droplet ejecting head, in general, as disclosed in JP-A-2006-281763, the piezoelectric elements and a reservoir forming substrate (wiring substrate) on which the reservoir is formed are bonded to one surface of a flow channel forming substrate (base substrate) on which the pressure generation chambers are formed. The driver IC is bonded to the surface of the reservoir forming substrate opposite to the flow channel forming substrate and electrically connected to the piezoelectric elements through wirings provided on the reservoir forming substrate.

A step occurs between the driver IC and the piezoelectric elements due to the thickness of the reservoir forming substrate, and it is necessary to electrically connect the driver IC and the piezoelectric elements through this step. Accordingly, in the liquid droplet ejecting head described in JP-A-2006-281763, the lateral surface of the reservoir forming substrate is an inclined surface, and wirings which electrically connect the driver IC and the piezoelectric elements are formed on the inclined surface.

SUMMARY OF INVENTION

Technical Problem

On the other hand, in recent years, in order to realize image formation or manufacturing of wiring with higher definition, it is desirable to decrease the pitch between nozzles or to decrease the pitch between wirings. If the pitch between the nozzles or the pitch between the wirings decreases, accordingly, the pitch between the terminals of the piezoelectric elements or between the terminals of various elements decreases. However, in the liquid droplet ejecting head described in JP-A-2006-281763, since the surface on which the wirings are formed is one lateral surface of the reservoir forming substrate, a minimum portion of the pitch between the wirings is the same as the pitch between the terminals of the piezoelectric elements. For this reason, if the pitch between the terminals of the piezoelectric elements decreases, there is a problem in that it is difficult to form the wirings.

An advantage of some aspects of the invention is to provide a wiring structure and a method of manufacturing a wiring structure capable of facilitating formation of wirings even if the pitch between a plurality of terminals decreases in a wiring structure in which the plurality of terminals on a base substrate and the wirings on a wiring substrate bonded to the base substrate are electrically connected, and a liquid droplet ejecting head and a liquid droplet ejecting apparatus including the wiring structure.

Solution to Problem

A wiring structure according to an aspect of the invention includes a base substrate on which a first terminal group having a first terminal and a second terminal arranged in a predetermined direction and a second terminal group provided parallel to the first terminal group and having a third terminal and a fourth terminal arranged in the predetermined direction are formed, a wiring substrate which is bonded to the base substrate, and has a first wiring forming portion having a first inclined surface and a second inclined surface at an acute angle with respect to the base substrate and a second wiring forming portion having a third inclined surface and a fourth inclined surface at an acute angle with respect to the base substrate, a first wiring which is formed on the first inclined surface and is electrically connected to the first terminal, a second wiring which is formed on the second inclined surface and is electrically connected to the second terminal, a third wiring which is formed on the third inclined surface and is electrically connected to the third terminal, and a fourth wiring which is formed on the fourth inclined surface and is electrically connected to the fourth terminal.

According to this wiring structure, since the first wiring and the second wiring are formed on separate inclined surfaces, it is possible to make the pitch between the first wirings and the pitch between the second wirings greater than the pitch between the first terminal and the second terminal. For this reason, even if the pitch between the first terminal and the second terminal decreases, it is possible to easily form the first wiring and the second wiring. Similarly, since the third wiring and the fourth wiring are formed on separate inclined surfaces, it is possible to make the pitch between the third wirings and the pitch between the fourth wirings greater than the pitch between the third terminal and the fourth terminal. For this reason, even if the pitch between the third terminal and the fourth terminal decreases, it is possible to easily form the third wiring and the fourth wiring.

In the wiring structure according to the aspect of the invention, it is preferable that the first wiring forming portion has a first connecting surface which connects the first inclined surface and the second inclined surface on an opposite side to the base substrate, a fifth terminal which is electrically connected to the first wiring and a sixth terminal which is electrically connected to the second wiring are formed on the first connecting surface, the second wiring forming portion has a second connecting surface which connects the third inclined surface and the fourth inclined surface on an opposite side to the base substrate, and a seventh terminal which is electrically connected to the third wiring and an eighth terminal which is electrically connected to the fourth wiring are formed on the second connecting surface.

Accordingly, it is possible to easily electrically connect a semiconductor device or an IC package arranged on the wiring substrate and the fifth, sixth, seventh, and eighth terminals.

In the wiring structure according to the aspect of the invention, it is preferable that a plurality of first terminals and a plurality of second terminals are alternately arranged in parallel, and a plurality of third terminals and a plurality of fourth terminals are alternately formed in parallel. Accordingly, it is possible to increase the pitch between the first wirings and the pitch between the second wirings, and as a result, it is possible to easily form the first wiring and the second wiring. Similarly, it is possible to increase the pitch between the third wirings and the pitch between the fourth wirings, and as a result, it is possible to easily form the third wiring and the fourth wiring.

In the wiring structure according to the aspect of the invention, it is preferable that one end of the first wiring is formed to overlap the first terminal, one end of the second wiring is formed to overlap the second terminal, one end of the third wiring is formed to overlap the third terminal, and one end of the fourth wiring is formed to overlap the fourth terminal. Accordingly, it is possible to perform electrical connection of the first, second, third, and fourth wirings and the first, second, third, and fourth terminals simply and reliably.

In the wiring structure according to the aspect of the invention, it is preferable that the first wiring and the first terminal, the second wiring and the second terminal, the third wiring and the third terminal, and the fourth wiring and the fourth terminal are respectively electrically connected through conductive connecting members.

Accordingly, it is possible to perform electrical connection of the first, second, third, and fourth wirings and the first, second, third, and fourth terminals simply and reliably.

In the wiring structure according to the aspect of the invention, it is preferable that the wiring substrate is bonded to the base substrate by an insulating adhesive.

Accordingly, a wiring structure having excellent mechanical strength is obtained.

In the wiring structure according to the aspect of the invention, it is preferable that the wiring substrate is made of silicon, and the first inclined surface, the second inclined surface, the third inclined surface, and the fourth inclined surface are formed along the crystal plane of silicon.

Accordingly, it is possible to form the wiring substrate simply with high precision.

A method of manufacturing a wiring structure according to another aspect of the invention includes bonding a wiring substrate, which has a first wiring forming portion having a first inclined surface and a second inclined surface at an acute angle with respect to a base substrate and a second wiring forming portion having a third inclined surface and a fourth inclined surface at an acute angle with respect to the base substrate, to the base substrate on which a first terminal group having a first terminal and a second terminal arranged in a predetermined direction and a second terminal group provided parallel to the first terminal group and having a third terminal and a fourth terminal arranged in the predetermined direction are formed, and placing the first terminal in an exposed state from the first inclined surface, the second terminal in an exposed state from the second inclined surface, the third terminal in an exposed state from the third inclined surface, and the fourth terminal in an exposed state from the fourth inclined surface, and forming a first wiring to be electrically connected to the first terminal on the first inclined surface, forming a second wiring to be electrically connected to the second terminal on the second inclined surface, forming a third wiring to be electrically connected to the third terminal on the third inclined surface, and forming a fourth wiring to be electrically connected to the fourth terminal on the fourth inclined surface.

According to the method of manufacturing a wiring structure, it is possible to prevent disconnection or short circuiting, and to manufacture a reliable wiring structure.

A method of manufacturing a wiring structure according to still another aspect of the invention includes bonding a wiring substrate, which has a first wiring forming portion having a first inclined surface and a second inclined surface at an acute angle with respect to a base substrate and a second wiring forming portion having a third inclined surface and a fourth inclined surface at an acute angle with respect to the base substrate, a first wiring being formed on the first inclined surface, a second wiring being formed on the second inclined surface, a third wiring being formed on the third inclined surface, and a fourth wiring being formed on the fourth inclined surface, to the base substrate on which a first terminal group having a first terminal and a second terminal arranged in a predetermined direction and a second terminal group provided parallel to the first terminal group and having a third terminal and a fourth terminal arranged in the predetermined direction are formed, and placing the first terminal in an exposed state from the first inclined surface, the second terminal in an exposed state from the second inclined surface, the third terminal in an exposed state from the third inclined surface, and the fourth terminal in an exposed state from the fourth inclined surface, and electrically connecting the first wiring and the first terminal, the second wiring and the second terminal, the third wiring and the third terminal, and the fourth wiring and the fourth terminal through conductive connecting members.

According to the method of manufacturing a wiring structure, it is possible to prevent disconnection or short circuiting, and to manufacture a reliable wiring structure.

A liquid droplet ejecting head according to yet another aspect of the invention includes the wiring structure according to the aspect of the invention.

Accordingly, a reliable liquid droplet ejecting head is obtained.

A liquid droplet ejecting apparatus according to still yet another aspect of the invention includes the liquid droplet ejecting head according to the aspect of the invention.

Accordingly, a reliable liquid droplet ejecting apparatus is obtained.

DESCRIPTION OF EMBODIMENTS

Hereinafter, a wiring structure, a method of manufacturing a wiring structure, a liquid droplet ejecting head, and a liquid droplet ejecting apparatus according to the invention will be described in detail on the basis of preferred embodiments shown in the accompanying drawings.

First Embodiment

Figure 1:
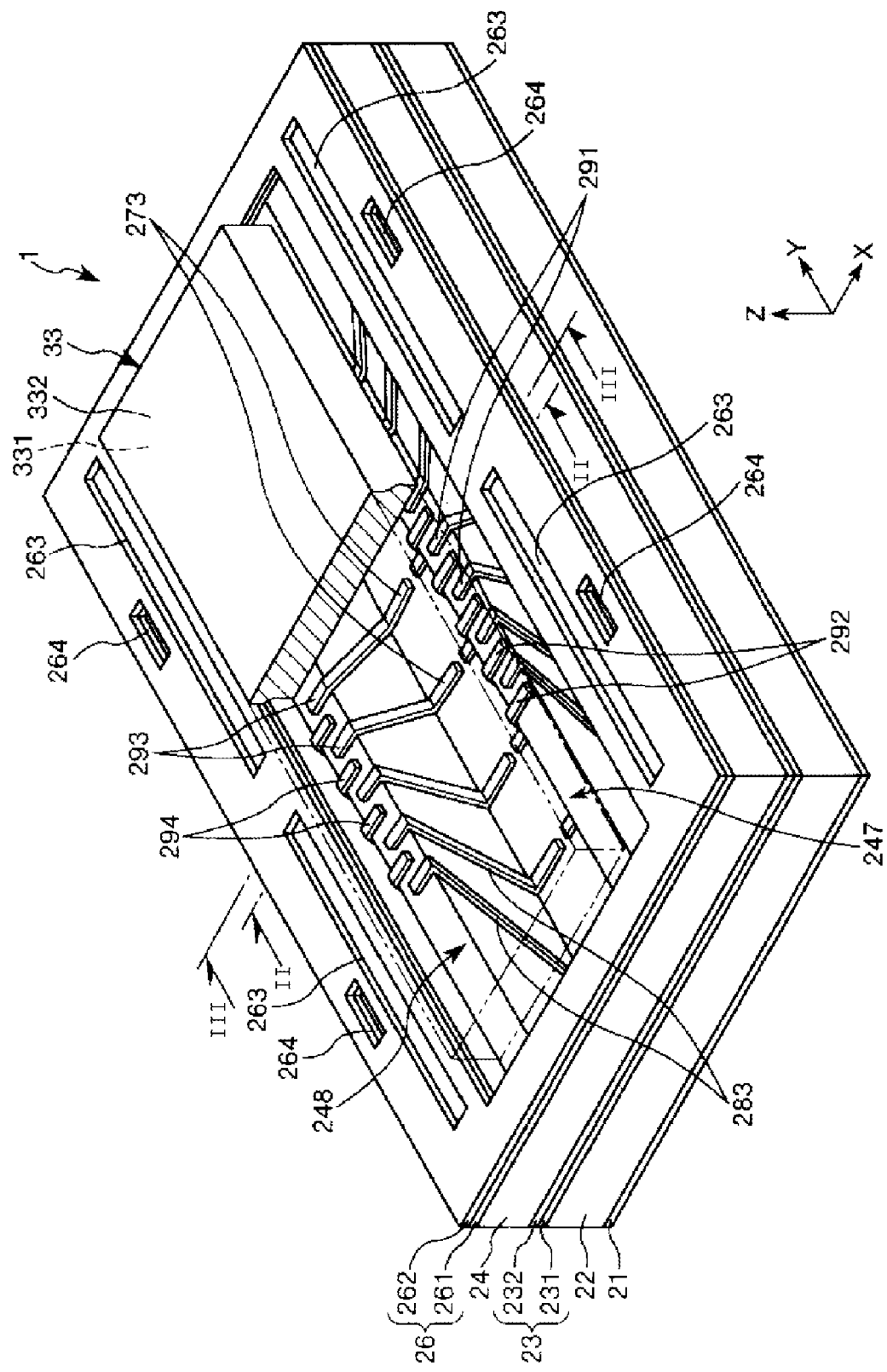
FIG. 1 is a perspective view showing a liquid droplet ejecting head (wiring structure) according to a first embodiment of the invention.
Figure 2:
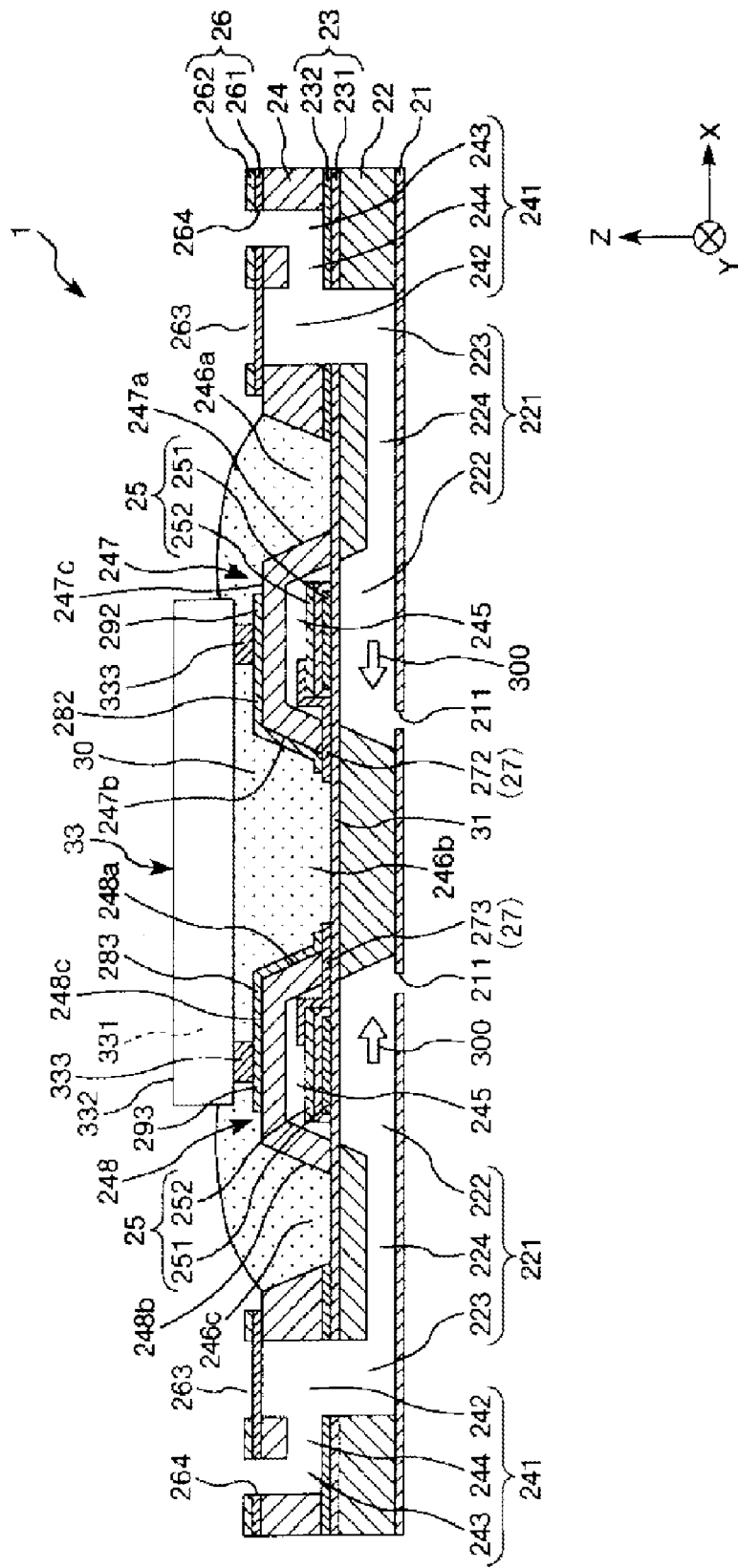
FIG. 2 is a sectional view taken along the line II-II of FIG. 1.
Figure 3:
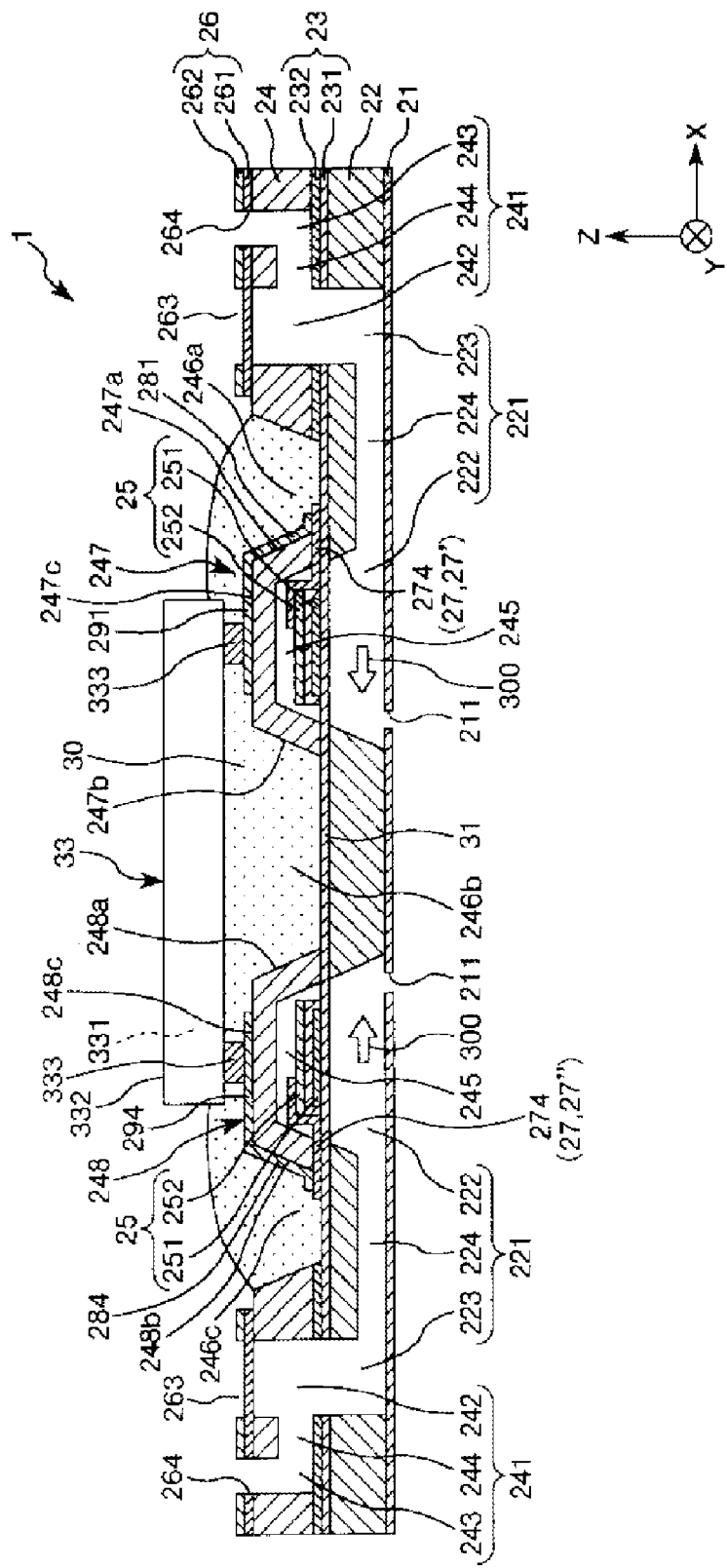
FIG. 3 is a sectional view taken along the line of FIG. 1.
Figure 4:
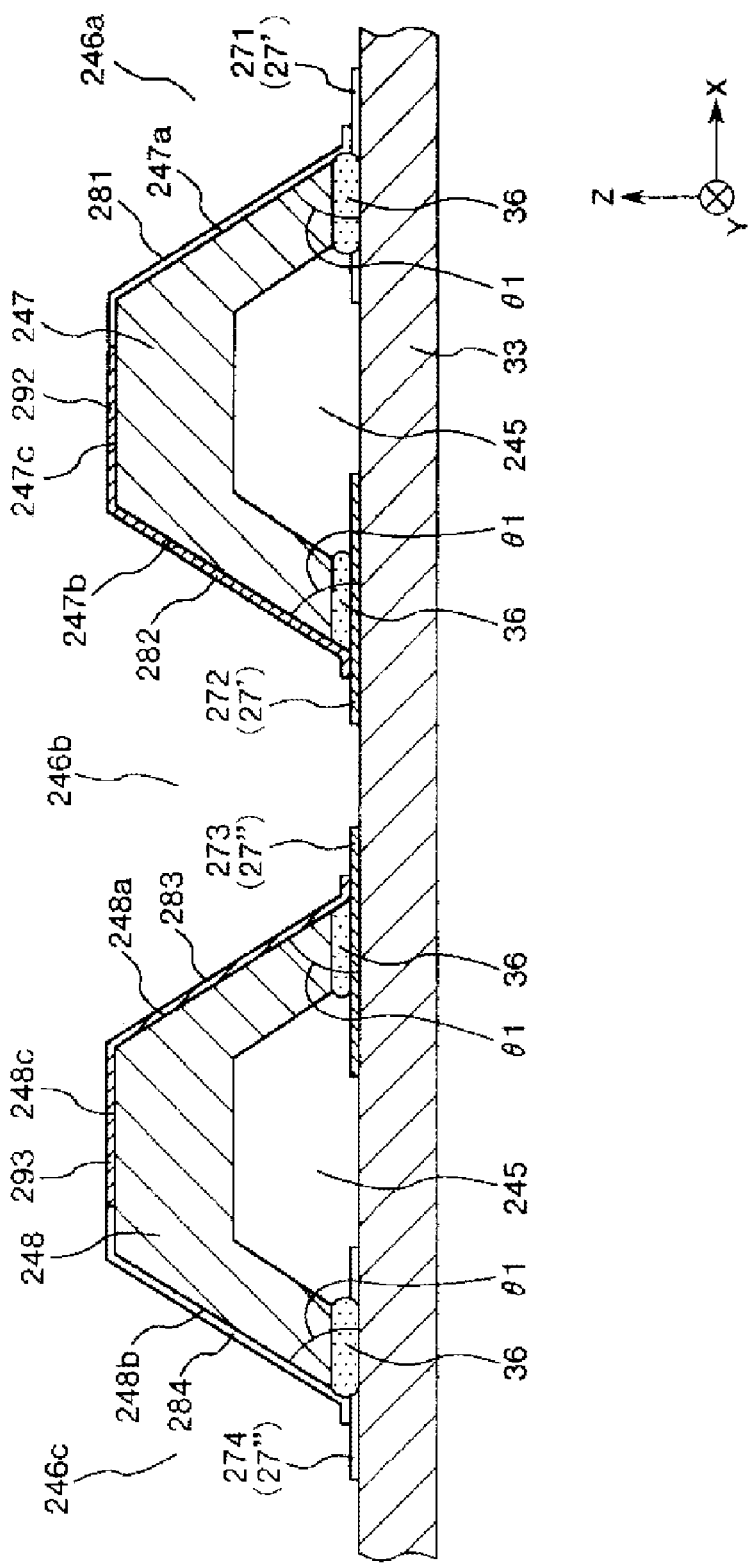
FIG. 4 is a sectional view illustrating a base substrate and a wiring substrate of the liquid droplet ejecting head shown in FIG. 1.
Figure 5:
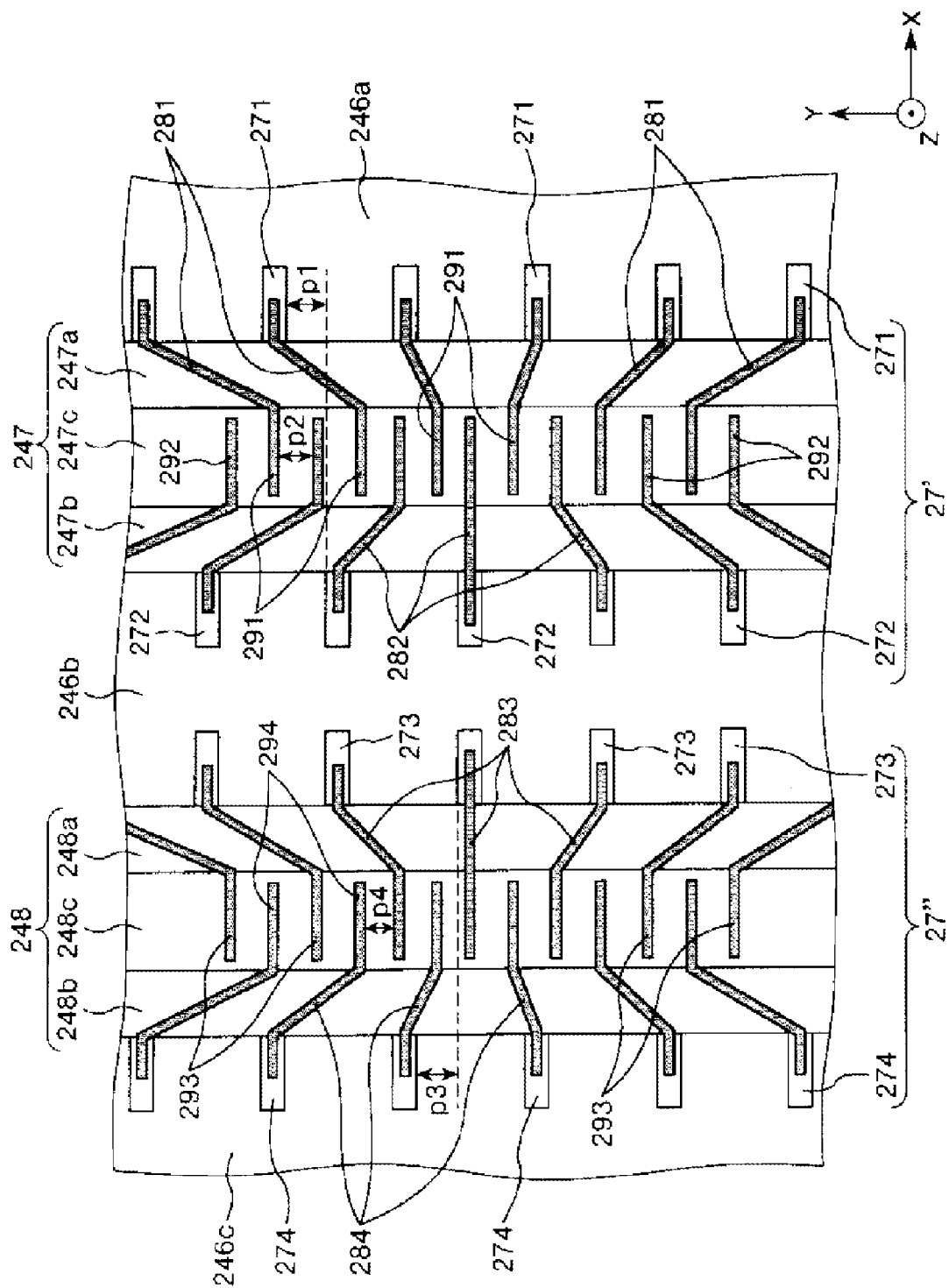
FIG. 5 is a plan view illustrating a wiring pattern of the liquid droplet ejecting head shown in FIG. 1.

FIG. 1 is a perspective view showing a liquid droplet ejecting head (wiring structure) according to a first embodiment of the invention. FIG. 2 is a sectional view taken along the line II-II of FIG. 1. FIG. 3 is a sectional view taken along the line III-III of FIG. 1. FIG. 4 is a sectional view illustrating a base substrate and a wiring substrate of the liquid droplet ejecting head shown in FIG. 1. FIG. 5 is a plan view illustrating a wiring pattern of the liquid droplet ejecting head shown in FIG. 1. FIGS. 6A to 6C to FIGS. 9A and 9B are sectional views illustrating a method of manufacturing the liquid droplet ejecting head shown in FIG. 1.

In FIGS. 1 to 5, for convenience of description, an X axis, a Y axis, and a Z axis are shown as three axes orthogonal to each other, the leading end side of each arrow shown in the drawings is referred to as "+ (plus)", and the base end side of each arrow is referred to as "− (minus)". In the following description, the direction parallel to the X axis is referred to as "X-axis direction", the direction parallel to the Y axis is referred to as "Y-axis direction", and the direction parallel to the Z axis is referred to as "Z-axis direction". The +Z axis side is referred to as "upward", and the −Z axis side is referred to as "downward".

A liquid droplet ejecting head (wiring structure) 1 shown in FIGS. 1, 2, and 3 is used in a state of being mounted in, for example, a liquid droplet ejecting apparatus (printing apparatus) 100 described below. The liquid droplet ejecting head 1 has a nozzle substrate 21, a flow channel forming substrate 22, a vibrating plate (base substrate) 23, a reservoir forming substrate (wiring substrate) 24, a plurality of piezoelectric elements 25, a compliance substrate 26, and an IC package 33.

The nozzle substrate 21, the flow channel forming substrate 22, the vibrating plate 23, the reservoir forming substrate 24, and the compliance substrate 26 are laminated in this order from below in FIG. 2. These substrates are bonded such that two adjacent substrates are bonded together by, for example, an adhesive, a thermal welding film, or the like.

In the liquid droplet ejecting head 1 having the above-described configuration, the piezoelectric elements 25 vibrate the vibrating plate 23 to change pressure in pressure generation chambers 222 of flow channels 221 formed in the flow channel forming substrate 22, such that ink 300 is ejected as liquid droplets from ejection ports 211 formed in the nozzle substrate 21.

Hereinafter, the respective units of the liquid droplet ejecting head 1 will be sequentially described in detail.

Nozzle Substrate

As shown in FIGS. 2 and 3, in the nozzle substrate 21, the plurality of ejection ports (nozzles) 211 are formed to pass through the nozzle substrate 21 in the thickness direction. In this embodiment, the plurality of ejection ports 211 are arranged in a matrix. Specifically, the nozzle substrate 21 has an elongated shape in which the Y-axis direction is a longitudinal direction, and the plurality of ejection ports 211 are arranged in n rows (where n is an integer equal to or greater than one) in the longitudinal direction (Y-axis direction) of the nozzle substrate 21 and in two columns in the width direction (X-axis direction).

A constituent material of the nozzle substrate 21 is not particularly limited, and for example, a silicon material or stainless steel is preferably used. Since these materials are excellent in chemical resistance, even if the nozzle substrate 21 is exposed to the ink 300 for a long time, it is possible to reliably prevent the nozzle substrate 21 from being degenerated or deteriorated. Since these materials are excellent in processability, the nozzle substrate 21 with high dimensional precision is obtained. For this reason, the reliable liquid droplet ejecting head 1 is obtained.

The nozzle substrate 21 can be obtained by forming the ejection ports 211 in a substrate made of the above-described materials by etching, laser processing, or the like.

Flow Channel Forming Substrate

In the flow channel forming substrate 22, the flow channels 221 through which the ink 300 passes toward each ejection port 211 are formed. As shown in FIG. 2, the flow channel 221 has the plurality of pressure generation chambers 222, a relay chamber 223 (communicating portion), and a plurality of communicating channels 224 (supply channels) which communicate the plurality of pressure generation chambers 222 with the relay chamber 223.

The plurality of pressure generation chambers 222 are provided corresponding to the plurality of ejection ports 211. In this embodiment, the plurality of pressure generation chambers 222 are arranged in n rows (where n is an integer equal to or greater than one) in the Y-axis direction and in two columns in the X-axis direction corresponding to the plurality of ejection ports 211.

The relay chamber 223 is provided on the upstream side in the flow direction of the ink 300 with respect to the pressure generation chambers 222. The communicating channels 224 are provided between the pressure generation chambers 222 and the relay chamber 223.

A constituent material of the flow channel forming substrate 22 is not particularly limited, and for example, the same constituent material as the nozzle substrate 21 may be used. The flow channel forming substrate 22 can be obtained by forming the flow channels 221 in a substrate made of the above-described materials by etching.

Vibrating Plate

The vibrating plate 23 is configured to vibrate in the thickness direction. A part of the vibrating plate 23 faces the pressure generation chambers 222. That is, a part of the vibrating plate 23 constitutes a part of a wall portion which partitions the pressure generation chambers 222. Accordingly, the vibrating plate 23 vibrates to change pressure in the pressure generation chambers 222, whereby the ink 300 can be ejected as liquid droplets from the pressure generation chambers 222 through the ejection ports 211.

The vibrating plate 23 has an elastic film 231 and a lower electrode film 232 laminated in order from the flow channel forming substrate 22 side.

The elastic film 231 is constituted by, for example, a silicon oxide film having a thickness of about 1 to 2 micrometers. The lower electrode film 232 is constituted by, for example, a metal film having a thickness of about 0.2 micrometers. The lower electrode film 232 also functions as a common electrode of the plurality of piezoelectric elements 25.

The configuration of the lower electrode film 232 is not particularly limited insofar as the constituent material is conductive, and for example, various metal materials, such as Ni, Cr, Au, Pd, Ti, W, and Cu, and an alloy thereof may be used. As a specific configuration of the lower electrode film 232, for example, a configuration in which an electrode layer made of Au (or Au-based alloy) is laminated on an underlayer made of a Ni—Cr-based alloy or a configuration in which an electrode layer made of Cu (or Cu-based alloy) is laminated on an underlayer made of a Ti—W-based alloy is made.

Reservoir Forming Substrate

As shown in FIGS. 2 and 4, the reservoir forming substrate 24 is bonded to the vibrating plate 23 through an insulating adhesive 36. Accordingly, it is possible to achieve improvement of mechanical strength of the liquid droplet ejecting head 1. Here, it is preferable that the adhesive 36 is provided to protrude inward through portions 246 described below. The thickness of the adhesive 36 is not particularly limited, and for example, is preferably about 1 micrometers.

As the adhesive 36, any material may be used insofar as the material has adhesiveness that can bond the reservoir forming substrate 24 and the vibrating plate 23 together, and for example, a resin composition including a resin material (in particular, hardening resin) may be used. The resin composition may contain an insulating filler.

In the reservoir forming substrate 24, a plurality of reservoirs 241 which temporarily store the ink 300 are formed to communicate with the plurality of flow channels 221 of the above-described flow channel forming substrate 22. As shown in FIG. 2, each reservoir 241 has a first chamber (reservoir portion) 242, a second chamber (introduction channel) 243, and a communicating channel 244 which communicates the first chamber 242 with the second chamber 243.

The first chamber 242 communicates with the relay chamber 223 of each flow channel 221 of the flow channel forming substrate 22. The vibrating plate 23 is cut between the first chamber 242 and the relay chamber 223, and accordingly, the first chamber 242 communicates with the relay chamber 223. The second chamber 243 is provided on the upstream side in the flow direction of the ink 300 with respect to the first chamber 242. The communicating channel 244 is provided between the first chamber 242 and the second chamber 243. In the liquid droplet ejecting head 1, it can be said that the relay chamber 223 constitutes a part of the reservoir 241.

As shown in FIGS. 2 and 3, in the reservoir forming substrate 24, three through portions 246a, 246b, and 246c are formed to be arranged in the X-axis direction. Accordingly, a first wiring forming portion 247 is formed between the through portions 246a and 246b, and a second wiring forming portion 248 is formed between the through portions 246b and 246c. In each of the first and second wiring forming portions 247 and 248, a concave portion which is opened downward is formed, and the concave portion functions as a piezoelectric element storage chamber 245 which stores the plurality of piezoelectric elements 25.

The first wiring forming portion 247 has a pair of first and second inclined surfaces 247a and 247b which are arranged in the X-axis direction, and an upper surface (connecting surface) 247c which connects the upper ends of the first and second inclined surfaces 247a and 247b. The first and second inclined surfaces 247a and 247b are inclined with respect to the plate surface (XY plane) of the reservoir forming substrate 24, and have an acute angle with respect to the vibrating plate 23. Similarly, the second wiring forming portion 248 has a pair of third and fourth inclined surfaces 248a and 248b which are arranged in the X-axis direction, and an upper surface (connecting surface) 248c which connects the upper ends of the third and fourth inclined surfaces 248a and 248b. The third and fourth inclined surfaces 248a and 248b are inclined with respect to the plate surface (XY plane) of the reservoir forming substrate 24, and have an acute angle with respect to the vibrating plate 23.

As shown in FIG. 4, an angle theta1 of each of the first, second, third, and fourth inclined surfaces 247a, 247b, 248a, and 248b with respect to the plate surface is not particularly limited, and is preferably about 50 to 60 degrees, more preferably, about 54 to 55 degrees. Accordingly, it is possible to achieve reduction in size (reduction in width) of the first and second wiring forming portions 247 and 248, and to form a wiring pattern 28 described below accurately and easily. If the angle theta1 is less than the lower limit value, the width (the length in the X-axis direction) of each of the inclined surfaces 247a to 248b increases too much depending on the height of each of the first and second wiring forming portions 247 and 248, causing an increase in size of the liquid droplet ejecting head 1. If the angle theta1 exceeds the upper limit value, the angle of each of the inclined surfaces 247a to 248b is too acute, making it difficult to form the wiring pattern 28 depending on a method of manufacturing the liquid droplet ejecting head 1 or the like.

The reservoir forming substrate 24 is made of silicon, and each of the inclined surfaces 247a to 248b is preferably formed along the crystal plane of silicon. Accordingly, it is possible to form the respective inclined surfaces 247a to 248b with high dimensional precision. For example, if a silicon substrate having a (100) plane orientation is subjected to wet etching (anisotropic etching) using an etching solution, such as KOH or nitric acid, to form the respective inclined surfaces 247a to 248b of the reservoir forming substrate 24, each of the inclined surfaces 247a to 248b can be constituted by a (111) plane of silicon, and the angle theta1 can be about 54.7 degrees. However, the reservoir forming substrate 24 may not be made of silicon, or may be made of, for example, an insulating material, such as a glass material.

On the surface of the reservoir forming substrate 24 having the above-described configuration, an insulating film (not shown) is formed. For example, if the reservoir forming substrate 24 is made of silicon, a silicon oxide film can be formed as an insulating film by thermal oxidation. The insulating film is formed, whereby it is possible to prevent short-circuiting between wirings 281 (see FIG. 5).

Piezoelectric Element

As shown in FIGS. 2 and 3, the plurality of piezoelectric elements 25 are arranged between the flow channel forming substrate 22 and the reservoir forming substrate 24 (the piezoelectric element storage chamber 245). The plurality of piezoelectric elements 25 are provided corresponding to the plurality of ejection ports 211 and the plurality of pressure generation chambers 222.

Each piezoelectric element 25 has a piezoelectric film 251 and an upper electrode film 252 laminated in order from the lower electrode film 232 side. As described above, since the lower electrode film 232 also functions as the common electrode of the plurality of piezoelectric elements 25, it can be said that the plurality of piezoelectric elements 25 are constituted by the lower electrode film 232, a plurality of piezoelectric films 251, and a plurality of upper electrode films 252. In each piezoelectric element 25, a voltage is applied between the upper electrode film 252 and the lower electrode film 232, whereby the piezoelectric film 251 is deformed by a piezoelectric effect. The deformation can cause the vibrating plate 23 to vibrate in the thickness direction.

Terminals 27 are electrically connected to the respective upper electrode films 252. Each terminal 27 extends from the upper electrode film 252 onto the elastic film 231 of the vibrating plate 23 through the lateral surface of the piezoelectric film 251. An end portion of the terminal 27 opposite to the upper electrode film 252 faces inside of one of the through portions 246a, 246b, and 246c of the reservoir forming substrate 24.

Description will be provided in detail. The plurality of terminals 27 (first terminal group 27') which are connected to the piezoelectric elements 25 arranged in the piezoelectric element storage chamber 245 of the first wiring forming portion 247 have a plurality of first terminals 271 and a plurality of second terminals 272 which are alternately arranged in the Y-axis direction at regular pitches. Each first terminal 271 is formed to face the through portion 246a from below the first inclined surface 247a, and to the contrary, each second terminal 272 is formed to face the through portion 246b from below the second inclined surface 247b.

The plurality of terminals 27 (second terminal group 27") which are connected to the piezoelectric elements 25 arranged in the piezoelectric element storage chamber 245 of the second wiring forming portion 248 are provided parallel to the first terminal group 27', and have a plurality of third terminals 273 and a plurality of fourth terminals 274 which are alternately arranged in the Y-axis direction at regular pitches. Each third terminal 273 is formed to face the through portion 246b from below the third inclined surface 248a, and to the contrary, each fourth terminal 274 is formed to face the through portion 246c from below the fourth inclined surface 248b.

The configuration of the upper electrode films 252 and the terminals 27 is not particularly limited insofar as the constituent materials are conductive, and various metal materials, such as Ni, Cr, Au, Pd, Ti, W, and Cu, and an alloy thereof may be used. As a specific configuration of the upper electrode films 252 and the terminals 27, for example, a configuration in which an electrode layer made of Au (or Au-based alloy) is laminated on an underlayer made of a Ni—Cr-based alloy, or a configuration in which an electrode layer made of Cu (or Cu-based alloy) is laminated on an underlayer made of a Ti—W-based alloy is made.

Wiring Pattern

As shown in FIG. 5, on the upper surface 247c of the first wiring forming portion 247, a fifth terminal 291 and a sixth terminal 292 are alternately arranged in the Y-axis direction and formed at a regular pitch. Similarly, on the upper surface 248c of the second wiring forming portion 248, a seventh terminal 293 and an eighth terminal 294 are alternately arranged in the Y-axis direction and formed at a regular pitch. The fifth to eighth terminals 291 to 294 are electrically connected to the IC package 33. In this way, the respective terminals 291, 292, 293, and 294 are provided on the upper surface of the reservoir forming substrate 24, whereby it is possible to easily perform electrical connection to the IC package 33.

The first wiring 281 is formed on the first inclined surface 247a so as to span the first inclined surface 247a. The first wiring 281 is electrically connected to the fifth terminal 291 in the upper end portion, and is electrically connected to the first terminal 271 in the lower end portion. That is, the first and fifth terminals 271 and 291 are electrically connected together by the first wiring 281. Here, since the lower end portion of the first wiring 281 is formed to overlap the first terminal 271, it is possible to perform connection of the first wiring 281 and the first terminal 271 reliably and easily.

Similarly, a second wiring 282 is formed on the second inclined surface 247b so as to span the second inclined surface 247b. The second wiring 282 is electrically connected to the sixth terminal 292 in the upper end portion, and is electrically connected to the second terminal 272 in the lower end portion. That is, the second and sixth terminals 272 and 292 are electrically connected together by the second wiring 282. Here, since the lower end portion of the second wiring 282 is formed to overlap the second terminal 272, it is possible to perform connection of the second wiring 282 and the second terminal 272 reliably and easily.

As shown in FIG. 5, it is designed such that a pitch p1 between the first and second terminals 271 and 272 is greater than a pitch p2 between the fifth and sixth terminals 291 and 292. For this reason, a plurality of first wirings 281 are formed so as to be centralized with a gradually decreasing pitch (the distance between adjacent first wirings 281) from the first terminal 271 side toward the fifth terminal 291 side. Similarly, a plurality of second wirings 282 are formed so as to be centralized with a gradually decreasing pitch from the second terminal 272 side toward the sixth terminal 292 side. The relationship between the pitches p1 and p2 is not limited to the relationship p1>p2, and may be the relationship p1<p2 or the relationship p1=p2.

A third wiring 283 is formed on the third inclined surface 248a so as to span the third inclined surface 248a. The third wiring 283 is electrically connected to the seventh terminal 293 in the upper end portion, and is electrically connected to the third terminal 273 in the lower end portion. That is, the third and seventh terminals 273 and 293 are electrically connected together by the third wiring 283. Here, since the lower end portion of the third wiring 283 is formed to overlap the third terminal 273, it is possible to perform connection of the third wiring 283 and the third terminal 273 reliably and easily.

Similarly, a fourth wiring 284 is formed on the fourth inclined surface 248b so as to span the fourth inclined surface 248b. The fourth wiring 284 is electrically connected to the eighth terminal 294 in the upper end portion, and is electrically connected to the fourth terminal 274 in the lower end portion. That is, the fourth and eighth terminals 274 and 294 are electrically connected together by the fourth wiring 284. Here, since the lower end portion of the fourth wiring 284 is formed to overlap the fourth terminal 274, it is possible to perform connection of the fourth wiring 284 and the fourth terminal 274 reliably and easily.

As shown in FIG. 5, it is designed such that a pitch p3 (=p1) between the third and fourth terminals 273 and 274 is greater than a pitch p4 (=p2) between the seventh and eighth terminals 293 and 294. For this reason, a plurality of third wirings 283 are formed so as to be centralized with a gradually decreasing pitch from the third terminal 273 side toward the seventh terminal 293 side. Similarly, a plurality of fourth wirings 284 are formed so as to be centralized with a gradually decreasing pitch from the fourth terminal 274 side toward the eighth terminal 294 side. The relationship between the pitches p3 and p4 is not limited to the relationship p3>p4, and may be the relationship p3<p4 or the relationship p3=p4. The relationship p3≠p1 or p2≠p4 may be established.

Since the respective inclined surfaces 247a, 247b, 248a, and 248b turn toward the upper surface of the reservoir forming substrate 24, the respective wirings 281, 282, 283, and 284 and the respective terminals 291, 292, 293, and 294 are provided on the surface toward the upper side of the reservoir forming substrate 24. For this reason, as described in a manufacturing method described below, the respective wirings 281, 282, 283, and 284 and the respective terminals 291, 292, 293, and 294 can be easily formed using vapor phase film deposition from the surface side.

The configuration of the respective wirings 281, 282, 283, and 284 and the respective terminals 291, 292, 293, and 294 is not particularly limited insofar as the constituent materials are conductive, and for example, various metal materials, such as Ni, Cr, Au, Pd, Ti, W, and Cu, and an alloy thereof may be used. As a specific configuration of the respective wirings 281, 282, 283, and 284 and the respective terminals 291, 292, 293, and 294, for example, a configuration in which an electrode layer made of Au (or Au-based alloy) is laminated on an underlayer made of a Ni—Cr-based alloy, or a configuration in which an electrode layer made of Cu (or Cu-based alloy) is laminated on an underlayer made of a Ti—W-based alloy is made.

A method of forming the respective wirings 281, 282, 283, and 284 and the respective terminals 291, 292, 293, and 294 is not particularly limited, and for example, various known film deposition methods may be used. For example, if the first wiring 281 has a laminated structure of an underlayer and an electrode layer, the underlayer and the electrode layer may be formed by a vapor phase film deposition method, such as sputtering, or the underlayer may be formed by a vapor phase film deposition method, such as sputtering and the electrode layer may be formed by electroless plating. The same applies to other wirings 282, 283, and 284 and the terminals 291, 292, 293, and 294.

Compliance Substrate

The compliance substrate 26 has a seal film 261 and a fixed plate 262 laminated in order from the reservoir forming substrate 24 side.

The seal film 261 is made of a flexible material (for example, a polyphenylene sulfide film having a thickness of about 6 micrometers). Apart of the seal film 261 faces the reservoir 241. The fixed plate 262 is made of a comparatively hard material (for example, stainless steel having a thickness of about 30 micrometers), such as a metal material. In the fixed plate 262, a region corresponding to a portion of the seal film 261 which faces the reservoir 241 is cut to form a cut portion 263.

In the compliance substrate 26, an introduction port 264 is formed to collectively pass through the seal film 261 and the fixed plate 262. The introduction port 264 is a portion which communicates with the reservoir 241 and introduces the ink 300 to the reservoir 241.

IC Package

The IC package 33 has a function of driving the plurality of piezoelectric elements 25. The IC package 33 has an electronic circuit (semiconductor device) 331, a casing (package) 332 which stores the electronic circuit 331, and a plurality of terminals 333 which protrude from the casing 332 and are electrically connected to the electronic circuit 331. The IC package 33 includes an IC chip (a connecting bump-equipped IC chip) or the like.

The electronic circuit 331 is constituted by, for example, a semiconductor, and includes a drive circuit for driving the piezoelectric elements 25. The casing 332 has a small piece shape or a plate shape and stores the electronic circuit 331 therein. A constituent material of the casing 332 is not particularly limited, and for example, various resin materials, various metal materials, ceramics, or the like may be used. The plurality of terminals 333 are electrically connected to the respective terminals 271, 272, 273, and 274 through the respective terminals 281, 282, 283, and 284.

Here, the plurality of terminals 333 are provided corresponding to the plurality of fifth, sixth, seventh, and eighth terminals 291, 292, 293, and 294. The respective terminals 333 are in contact with the corresponding terminals (the fifth, sixth, seventh, and eighth terminals 291, 292, 293, and 294). Accordingly, the electronic circuit 331 is electrically connected to the plurality of terminals 291, 292, 293, and 294 through the respective terminals 333.

A constituent material of the respective terminals 333 is not particularly limited, and for example, a metal material, such as gold or copper, having comparatively small electrical resistance may be used.

In this embodiment, the IC package 33 is provided on the upper surface side of the reservoir forming substrate 24. An adhesive (filler) 30 is filled between the IC package 33 and the reservoir forming substrate 24. Accordingly, the IC package 33 can be fixed to the reservoir forming substrate 24, and the respective wirings 281, 282, 283, and 284 and the respective terminals 291, 292, 293, and 294 can be blocked from the outside and protected. As a result, it is possible to effectively prevent corrosion, deterioration, or the like of the wiring pattern.

According to the liquid droplet ejecting head 1 described above, since the plurality of first wirings 281 and the plurality of second wirings 282 are formed on separate inclined surfaces, it is possible to make the pitch between the plurality of first wirings 281 and the pitch between the plurality of second wirings 282 greater than the pitch between the first and second terminals 271 and 272 (the pitch between the fifth and sixth terminals 291 and 292). For this reason, even if the pitch between the first and second terminals 271 and 272 (the pitch between the fifth and sixth terminals 291 and 292) is made small, it is possible to easily form the plurality of first wirings 281 and the plurality of second wirings 282. Similarly, since the plurality of third wirings 283 and the plurality of fourth wirings 284 are formed on separate inclined surfaces, it is possible to make the pitch between the plurality of third wirings 283 and the pitch between the plurality of fourth wirings 284 greater than the pitch between the third and fourth terminals 273 and 274 (the pitch between the seventh and eighth terminals 293 and 294). For this reason, even if the pitch between the first and second terminals 271 and 272 (the pitch between the seventh and eighth terminals 293 and 294) is made small, it is possible to easily form the plurality of third wirings 283 and the plurality of fourth wirings 284.

Next, a method of manufacturing the above-described liquid droplet ejecting head 1 will be described referring to FIGS. 6A to 6C to FIGS. 9A and 9B.

A method of manufacturing the liquid droplet ejecting head 1 includes at least bonding the reservoir forming substrate 24, which has the first wiring forming portion 247 and the second wiring forming portion 248, to the vibrating plate (base substrate) 23, on which the first terminal group 27' and the second terminal group 27'' are formed, and forming the first wiring 281 electrically connected to the first terminal 271 on the first inclined surface 247a, forming the second wiring 282 electrically connected to the second terminal 272 on the second inclined surface 247b, forming the third wiring 283 electrically connected to the third terminal 273 on the third inclined surface 248a, and forming the fourth wiring 284 electrically connected to the fourth terminal 274 on the fourth inclined surface 248b. Hereinafter, this manufacturing method will be described in detail.

Figure 6A:
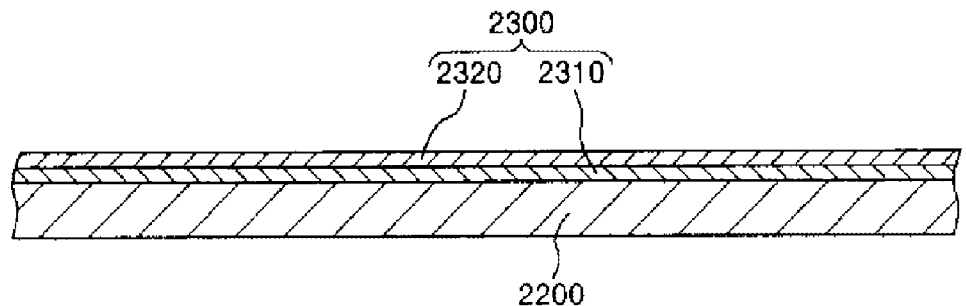
FIG. 6A is a sectional view illustrating a method of manufacturing the liquid droplet ejecting head shown in FIG. 1.
Figure 6B:
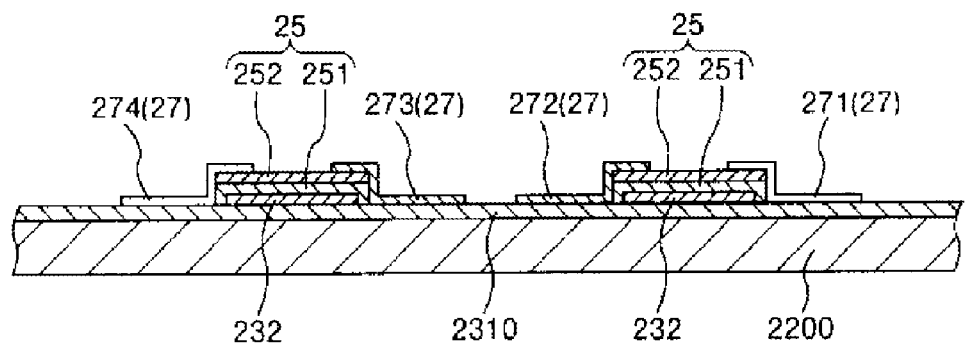
FIG. 6B is a sectional view illustrating a method of manufacturing the liquid droplet ejecting head shown in FIG. 1.
Figure 6C:
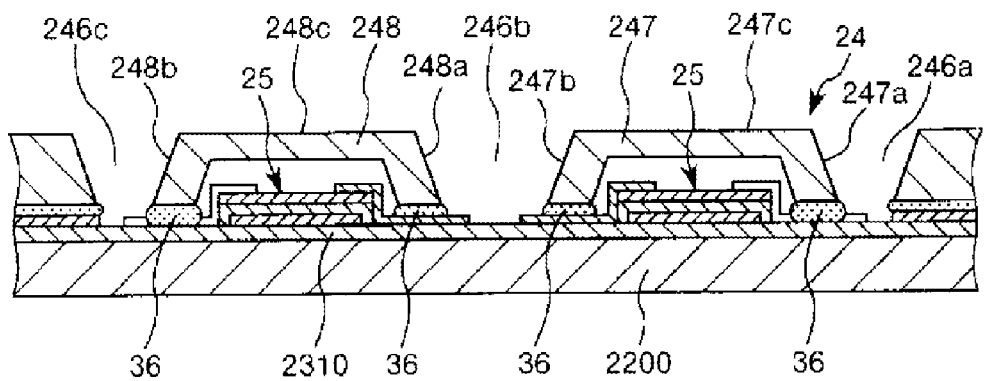
FIG. 6C is a sectional view illustrating a method of manufacturing the liquid droplet ejecting head shown in FIG. 1.

First, as shown in FIG. 6A, a laminate of a substrate 2300, which is constituted as a laminate of an elastic film 2310 and a lower electrode film 2320, and becomes the vibrating plate 23 later, and a substrate 2200, which becomes the flow channel forming substrate 22 later, is prepared. Next, as shown in FIG. 6B, for example, the lower electrode film 2320 is patterned using a photolithography technique and an etching technique to form the lower electrode film 232, and the piezoelectric elements 25 and the terminals 27 (the first, second, third, and fourth terminal 271, 272, 273, and 274) are formed on the substrate 2300. Next, as shown in FIG. 6C, the reservoir forming substrate 24 is prepared and is bonded to the upper surface of the substrate 2300 through the insulating adhesive 36. At this time, the adhesive 36 is provided so as to protrude inside the respective through portions 246a, 246b, and 246c.

In this state, the first terminal 271 passes below the first inclined surface 247a and faces the through portion 246a, the second terminal 272 passes below the second inclined surface 247b and faces the through portion 246b, the third terminal 273 passes below the third inclined surface 248a and faces the through portion 246b, and the fourth terminal 274 passes below the fourth inclined surface 248b and faces the through portion 246c.

Figure 7A:
FIG. 7A is a sectional view illustrating a method of manufacturing the liquid droplet ejecting head shown in FIG. 1.
Figure 7B:
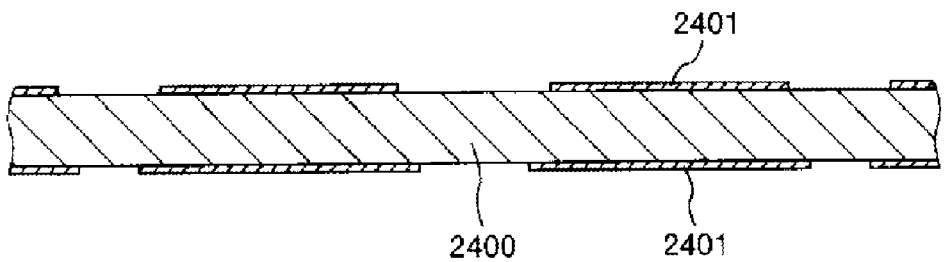
FIG. 7B is a sectional view illustrating a method of manufacturing the liquid droplet ejecting head shown in FIG. 1.
Figure 7C:
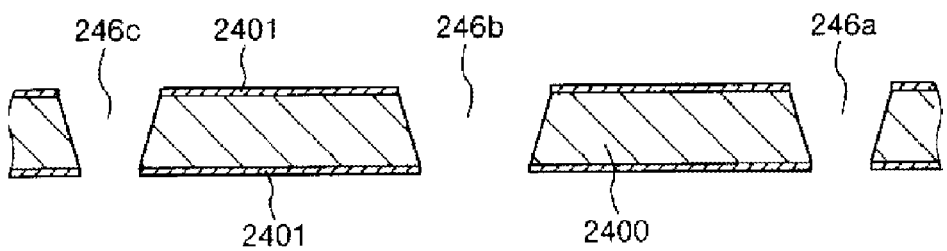
FIG. 7C is a sectional view illustrating a method of manufacturing the liquid droplet ejecting head shown in FIG. 1.

For example, the reservoir forming substrate 24 can be manufactured as follows. First, as shown in FIG. 7A, a silicon substrate 2400 having a (100) plane orientation is prepared. Next, as shown in FIG. 7B, the surface of the silicon substrate 2400 is thermally oxidized to form a $SiO_2$ film 2401 on the surface of the silicon substrate 2400, and a part (a portion corresponding to the through portions 246a, 246b, and 246c) of the $SiO_2$ film 2401 is removed by a photolithography technique and an etching technique. Next, as shown in FIG. 7C, the silicon substrate 2400 is subjected to wet etching using KOH with the $SiO_2$ film 2401 as a mask to form the through portions 246a, 246b, and 246c.

Figure 7D:
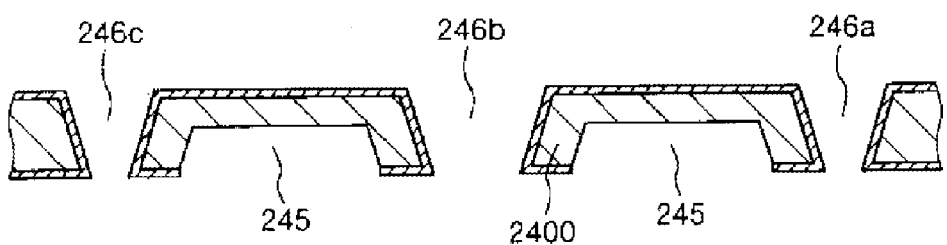
FIG. 7D is a sectional view illustrating a method of manufacturing the liquid droplet ejecting head shown in FIG. 1.
Figure 7E:
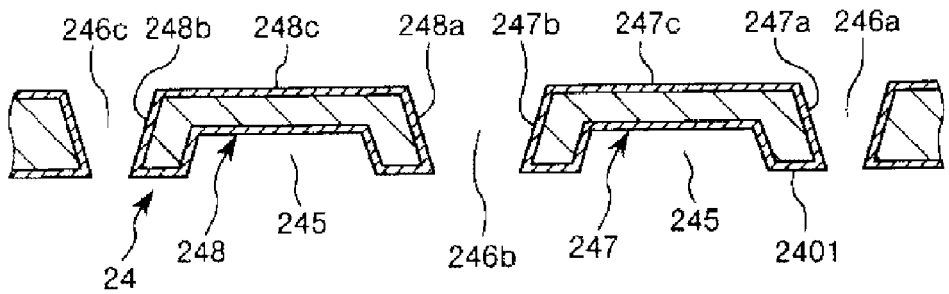
FIG. 7E is a sectional view illustrating a method of manufacturing the liquid droplet ejecting head shown in FIG. 1.

Next, as shown in FIG. 7D, for example, similarly to the formation of the through portions 246a, 246b, and 246c, the reservoir 241 (not shown) and the piezoelectric element storage chamber 245 are formed. Thereafter, the surface of the silicon substrate 2400 is thermally oxidized again to form the $SiO_2$ film 2401 on the surface of the silicon substrate 2400, and thus, as shown in FIG. 7E, the reservoir forming substrate 24 is obtained. According to this method, since the first, second, third, and fourth inclined surfaces 247a, 247b, 248a, and 248b are constituted by the (111) plane of silicon, the inclination with respect to the plate surface becomes about 54.7 degrees.

Figure 8A:
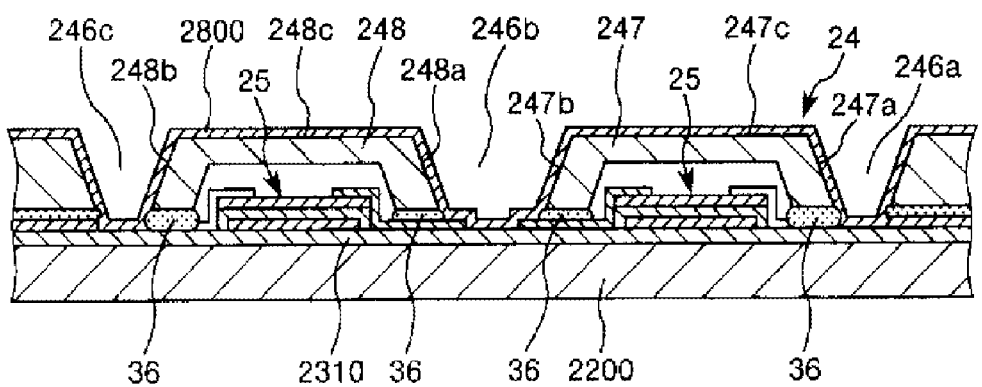
FIG. 8A is a sectional view illustrating a method of manufacturing the liquid droplet ejecting head shown in FIG. 1.
Figure 8B:
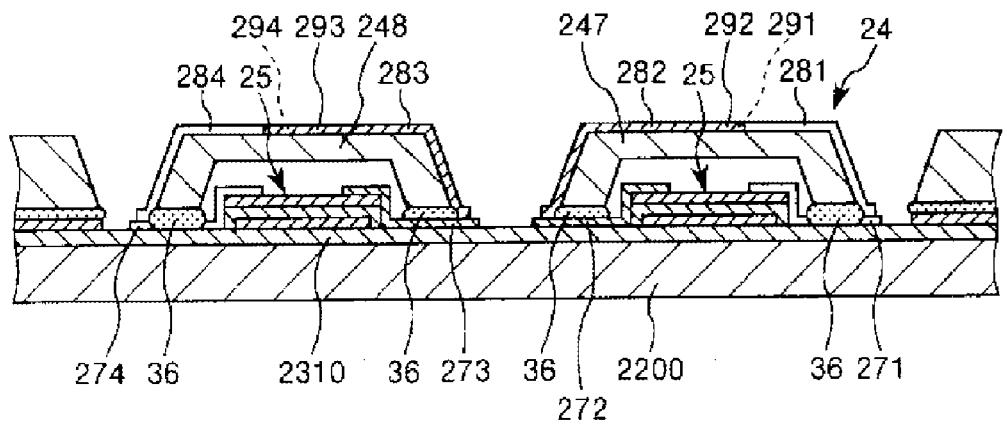
FIG. 8B is a sectional view illustrating a method of manufacturing the liquid droplet ejecting head shown in FIG. 1.

Next, as shown in FIG. 8A, for example, a metal film 2800 which becomes the first, second, third, and fourth wirings 281, 282, 283, and 284 and the fifth, sixth, seventh, and eighth terminals 291, 292, 293, and 294 later is formed on the surfaces of the first and second wiring forming portions 247 and 248 and the exposed portion of the elastic film 2310 in the through portions 246a, 246b, and 246c by sputtering or the like. At this time, as described above, the adhesive 36 protrudes inside the through portions 246a, 246b, and 246c, whereby the metal film 2800 can also be formed on the surface of the adhesive 36. For this reason, it is possible to reliably form the metal film 2800 even in the boundary of the respective inclined surfaces 247a, 247b, 248a, and 248b and the vibrating plate 23. As a result, it is possible to effectively prevent disconnection of the respective wirings 281, 282, 283, and 284 in the boundary. The configuration of the metal film 2800 is not particularly limited, and for example, a laminate of a Ni—Cr alloy layer and an Au layer may be used. Next, as shown in FIG. 8B, the metal film 2800 is patterned using a photolithography technique and an etching technique to form the first, second, third, and fourth wirings 281, 282, 283, and 284 and the fifth, sixth, seventh, and eighth terminals 291, 292, 293, and 294.

Figure 8C:
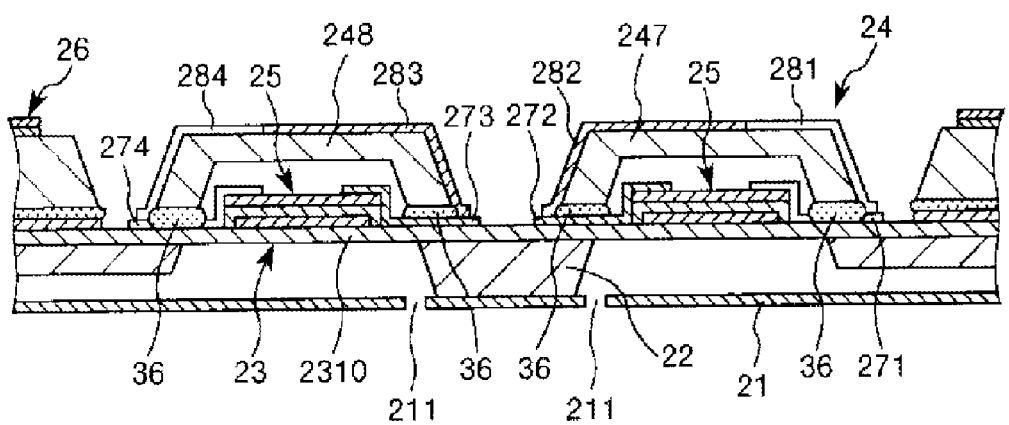
FIG. 8C is a sectional view illustrating a method of manufacturing the liquid droplet ejecting head shown in FIG. 1.
Figure 9A:
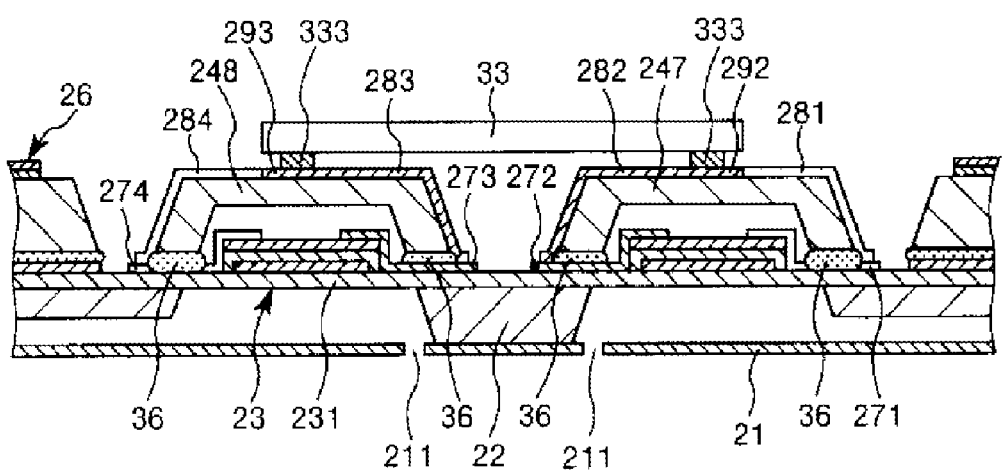
FIG. 9A is a sectional view illustrating a method of manufacturing the liquid droplet ejecting head shown in FIG. 1.
Figure 9B:
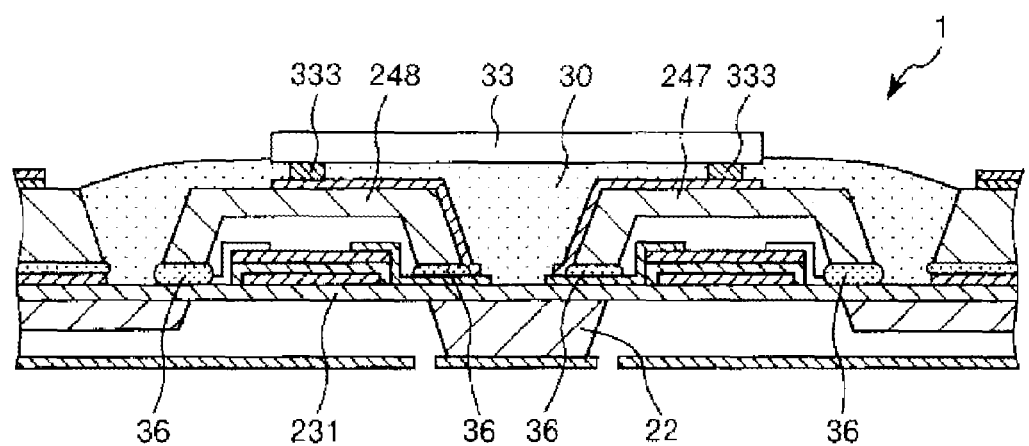
FIG. 9B is a sectional view illustrating a method of manufacturing the liquid droplet ejecting head shown in FIG. 1.

Next, as shown in FIG. 8C, the substrate 2200 and the elastic film 2310 are patterned in order using a photolithography technique and an etching technique, and thus the vibrating plate 23 and the flow channel forming substrate 22 are obtained. Next, the nozzle substrate 21 is bonded to the lower surface of the flow channel forming substrate 22, and the compliance substrate 26 is bonded to the upper surface of the reservoir forming substrate 24. For example, the bonding can be performed using an adhesive. Next, the IC package 33 is prepared, and as shown in FIG. 9A, the IC package 33 is bonded to the reservoir forming substrate 24 through the terminals 333. Finally, as shown in FIG. 9B, the through portions 246a, 246b, and 246c are filled with the adhesive 30, whereby the liquid droplet ejecting head 1 is obtained.

According to the method of manufacturing the liquid droplet ejecting head 1, it is possible to form the reliable liquid droplet ejecting head 1.

Second Embodiment

Next, a second embodiment of the liquid droplet ejecting head according to the invention will be described.

Figure 10:
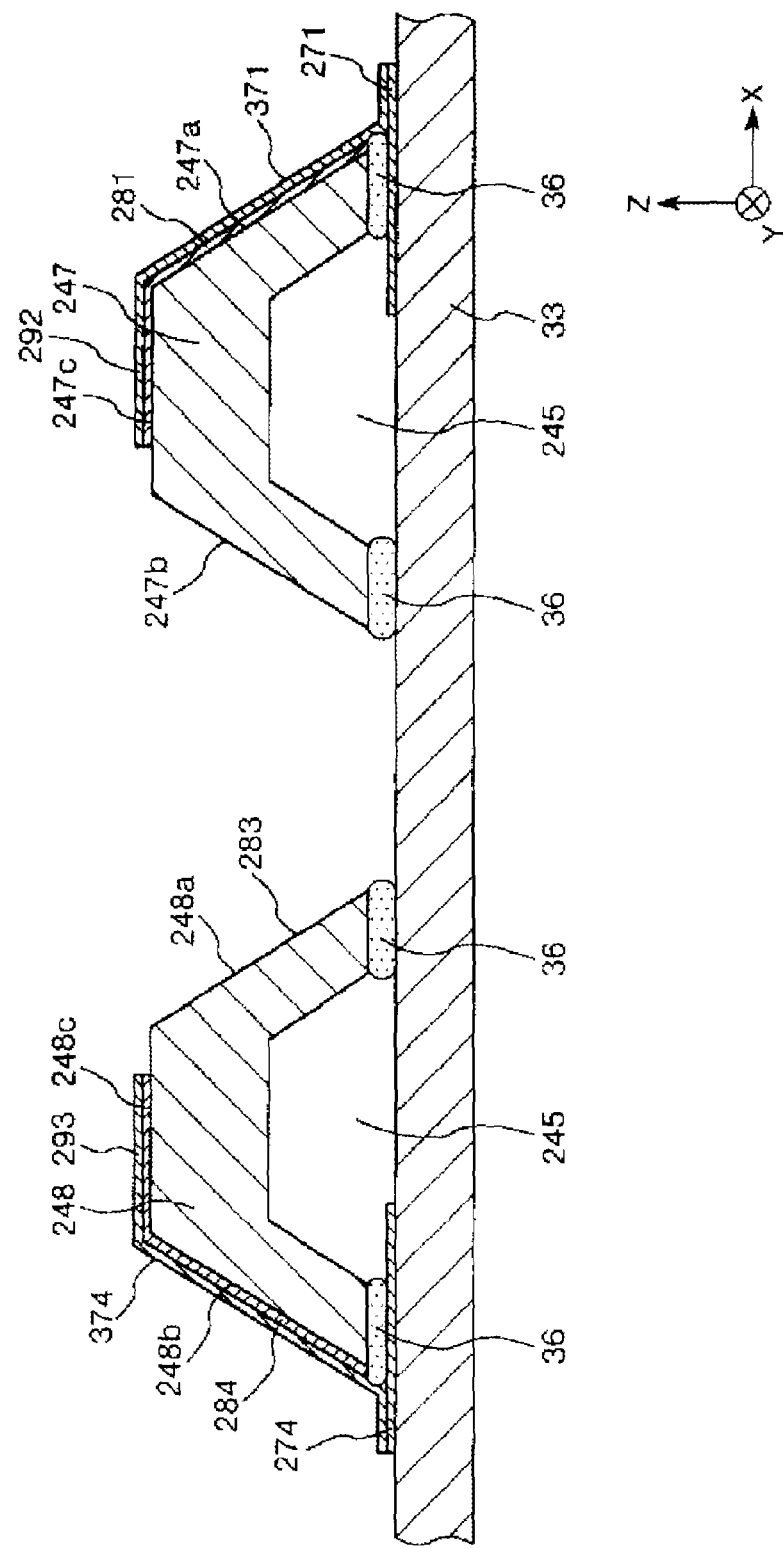
FIG. 10 is a sectional view illustrating a base substrate and a wiring substrate of a liquid droplet ejecting head according to a second embodiment of the invention.
Figure 11:
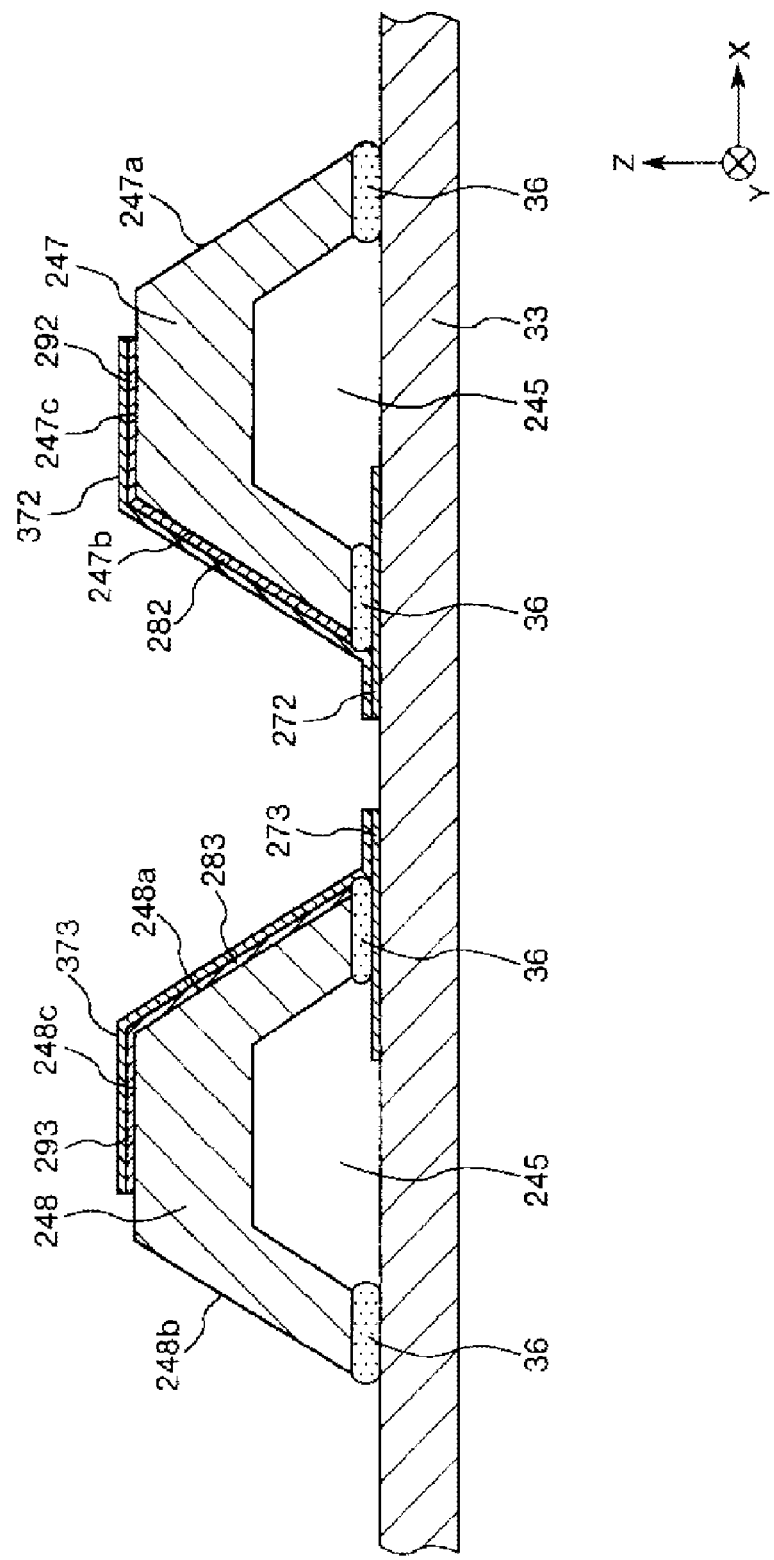
FIG. 11 is a sectional view illustrating the base substrate and the wiring substrate of the liquid droplet ejecting head according to the second embodiment of the invention.

FIGS. 10 and 11 are sectional views illustrating a base substrate and a wiring substrate of a liquid droplet ejecting head according to a second embodiment of the invention. FIGS. 12A to 12C to FIGS. 14A and 14B are sectional views illustrating a method of manufacturing the liquid droplet ejecting head shown in FIG. 10.

Hereinafter, the liquid droplet ejecting head of the second embodiment will be described focusing on a difference from the above-described first embodiment, and description on the same matters will not be repeated.

The liquid droplet ejecting head according to the second embodiment of the invention is the same as the above-described first embodiment, except that a method of connecting terminals and wirings is different. The same parts as those in the above-described first embodiment are represented by the same reference numerals.

As shown in FIG. 10, in the liquid droplet ejecting head 1 of this embodiment, the first wiring 281 is formed only to the lower end portion of the first inclined surface 247a and is not in direct contact with the first terminal 271. Then, a conductive connecting member 371 is formed so as to span the first wiring 281 and the first terminal 271, and the first terminal 271 and the first wiring 281 are electrically connected together by the connecting member 371.

As shown in FIG. 11, the second wiring 282 is formed only to the lower end portion of the second inclined surface 247b and is not in direct contact with the second terminal 272. Then, a conductive connecting member 372 is formed so as to span the second wiring 282 and the second terminal 272, and the second terminal 272 and the second wiring 282 are electrically connected together by the connecting member 372.

As shown in FIG. 11, the third wiring 283 is formed only to the lower end portion of the third inclined surface 248a and is not in direct contact with the third terminal 273. Then, a conductive connecting member 373 is formed so as to span the third wiring 283 and the third terminal 273, and the third terminal 273 and the third wiring 283 are electrically connected together by the connecting member 373.

As shown in FIG. 10, the fourth wiring 284 is formed only to the lower end portion of the fourth inclined surface 248b and is not in direct contact with the fourth terminal 274. Then, a conductive connecting member 374 is formed so as to span the fourth wiring 284 and the fourth terminal 274, and the fourth terminal 274 and the fourth wiring 284 are electrically connected together by the connecting member 374.

With this configuration, it is also possible to perform the connection of the first terminal 271 and the first wiring 281, the second terminal 272 and the second wiring 282, the third terminal 273 and the third wiring 283, and the fourth terminal 274 and the fourth wiring 284 reliably and easily. A constituent material of the connecting members 371, 372, 373, and 374 is not particularly limited insofar as the material is conductive, and for example, various metal materials, such as Ni, Cr, Au, Pd, Ti, W, and Cu, may be used. A method of manufacturing the connecting members 371, 372, 373, and 374 is not particularly limited, and for example, an electroless plating method is preferably used. Accordingly, it is possible to easily form the connecting members 371, 372, 373, and 374.

Next, a method of manufacturing the liquid droplet ejecting head 1 of this embodiment will be described.

A method of manufacturing the liquid droplet ejecting head 1 includes at least bonding the reservoir forming substrate 24, on which the first wiring forming portion 247 and the second wiring forming portion 248 are formed, the first wiring 281 is formed on the first inclined surface 247a, the second wiring 282 is formed on the second inclined surface 247b, the third wiring 283 is formed on the third inclined surface 248a, and the fourth wiring 284 is formed on the fourth inclined surface 248b, to the vibrating plate (base substrate) 23, on which the first terminal group 27' and the second terminal group 27" are formed, and electrically connecting the first wiring 281 and the first terminal 271, the second wiring 282 and the second terminal 272, the third wiring 283 and the third terminal 273, and the fourth wiring 284 and the fourth terminal 274 through the conductive connecting members 371, 372, 373, and 374. Hereinafter, this method of manufacturing the liquid droplet ejecting head 1 will be described in detail.

Figure 12A:
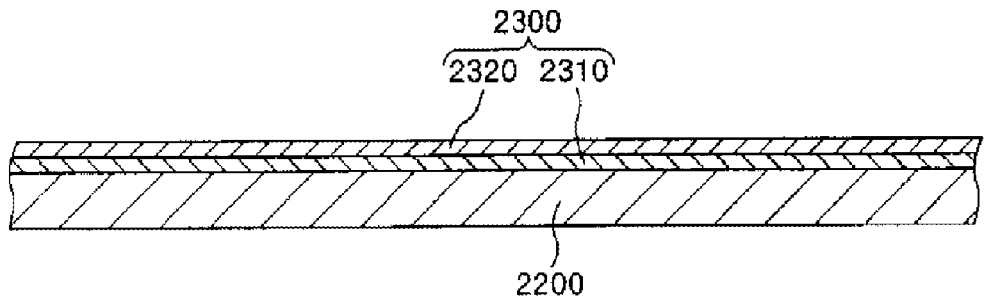
FIG. 12A is a sectional view illustrating a method of manufacturing the liquid droplet ejecting head shown in FIG. 10.
Figure 12B:
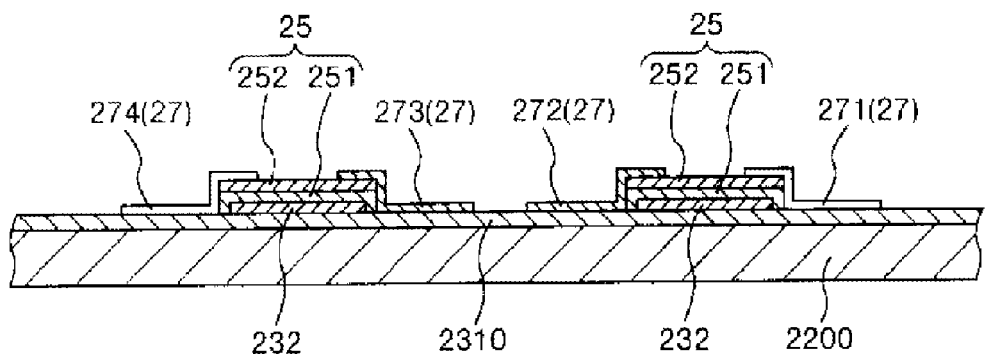
FIG. 12B is a sectional view illustrating a method of manufacturing the liquid droplet ejecting head shown in FIG. 10.

First, as shown in FIG. 12A, a laminate of a substrate 2300, which is a laminate of an elastic film 2310 and a lower electrode film 2320, and becomes the vibrating plate 23 later, and a substrate 2200, which becomes the flow channel forming substrate 22 later, is prepared. Next, as shown in FIG. 12B, for example, the lower electrode film 2320 is patterned using a photolithography technique and an etching technique to form the lower electrode film 232, and the piezoelectric elements 25 and the first, second, third, and fourth terminals 271, 272, 273, and 274 are formed on the substrate 2300.

Figure 12C:
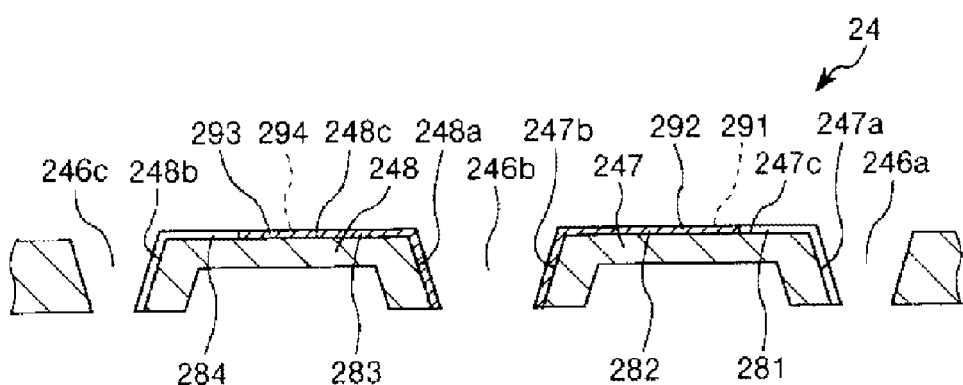
FIG. 12C is a sectional view illustrating a method of manufacturing the liquid droplet ejecting head shown in FIG. 10.
Figure 13A:
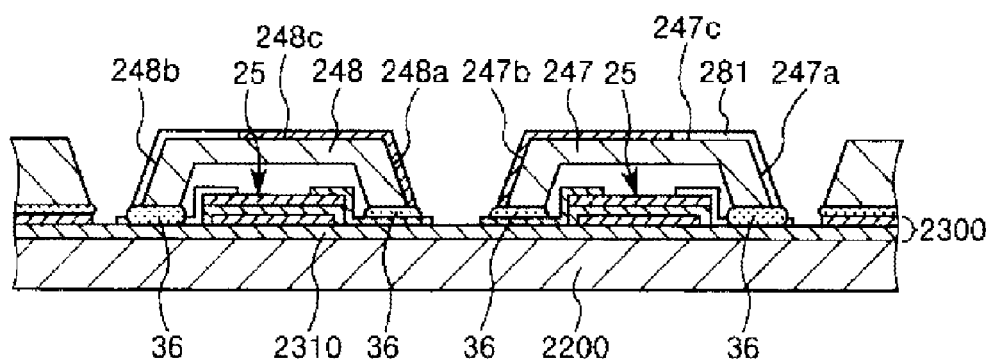
FIG. 13A is a sectional view illustrating a method of manufacturing the liquid droplet ejecting head shown in FIG. 10.

Next, as shown in FIG. 12C, the reservoir forming substrate 24 is prepared, the first and second wirings 281 and 282 and the fifth and sixth terminals 291 and 292 are formed on the first wiring forming portion 247, and the third and fourth wirings 283 and 284 and the seventh and eighth terminals 293 and 294 are formed on the second wiring forming portion 248. The formation of the reservoir forming substrate 24 and the formation of the respective wirings 281, 282, 283, and 284 and the respective terminals 291, 292, 293, and 294 can be performed using the same method as in the above-described first embodiment. Next, as shown in FIG. 13A, the reservoir forming substrate 24 is bonded to the upper surface of the substrate 2300 through the insulating adhesive 36. At this time, it is preferable that the adhesive 36 is provided so as to protrude inside the respective through portions 246a, 246b, and 246c. In this state, the first wiring 281 is not in contact with the first terminal 271, the second wiring 282 is not in contact with the second terminal 272, the third wiring 283 is not in contact with the third terminal 273, and the fourth wiring 284 is not in contact with the fourth terminal 294.

Figure 13B:
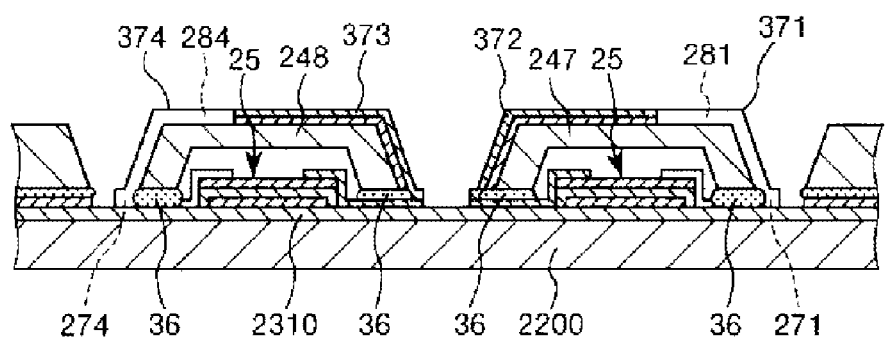
FIG. 13B is a sectional view illustrating a method of manufacturing the liquid droplet ejecting head shown in FIG. 10.

Next, a laminate obtained by the above-described process is immersed in an electroless plating solution, as shown in FIG. 13B, a metal film is educed on the first terminal 271 and the first wiring 281 to form the connecting member 371, a metal film is educed on the second terminal 272 and the second wiring 282 to form the connecting member 372, a metal film is educed on the third terminal 273 and the third wiring 283 to form the connecting member 373, and a metal film is educed on the fourth terminal 274 and the fourth wiring 284 to form the connecting member 374.

Here, as described above, while the first terminal 271 and the first wiring 281 are separated from each other by the thickness of the adhesive 36, since the connecting member 371 is formed to span the first terminal 271 and the first wiring 281 (specifically, since the connecting member 371 educed on the first terminal 271 and the connecting member 371 educed on the first wiring 281 are connected together), the first terminal 271 and the first wiring 281 are electrically connected together through the connecting member 371. The same applies to the connecting members 372, 373, and 374. The configuration of the connecting members 371, 372, 373, and 374 is not particularly limited, and for example, a laminated structure in which a Ni layer, a Pd layer, and an Au layer are laminated in order may be made.

Figure 13C:
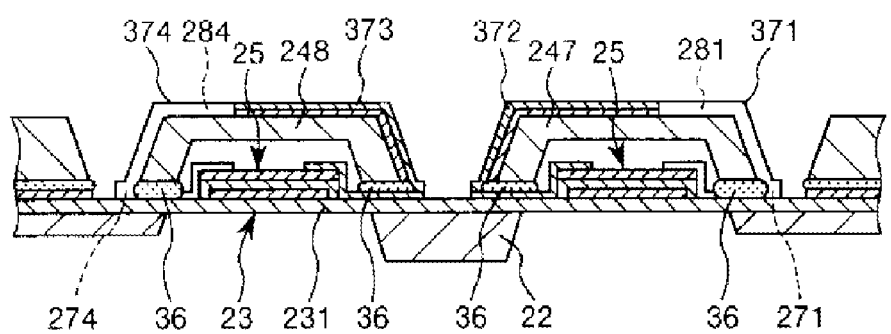
FIG. 13C is a sectional view illustrating a method of manufacturing the liquid droplet ejecting head shown in FIG. 10.
Figure 14A:
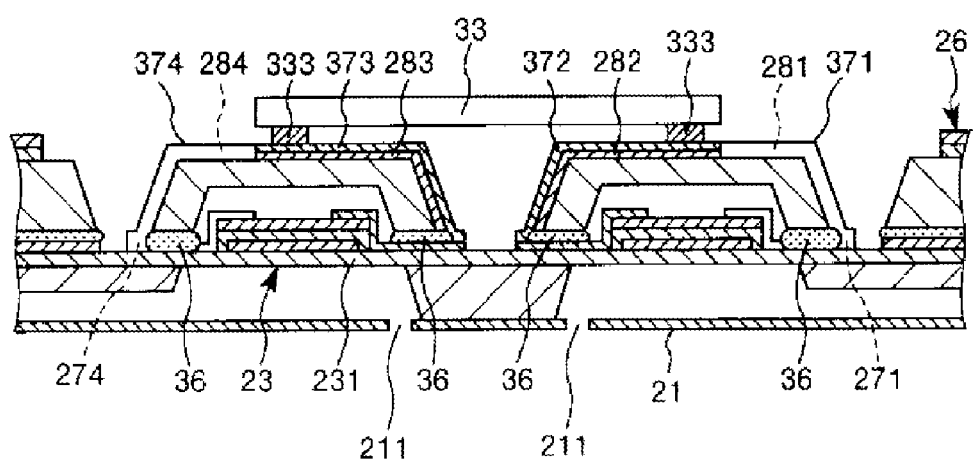
FIG. 14A is a sectional view illustrating a method of manufacturing the liquid droplet ejecting head shown in FIG. 10.
Figure 14B:
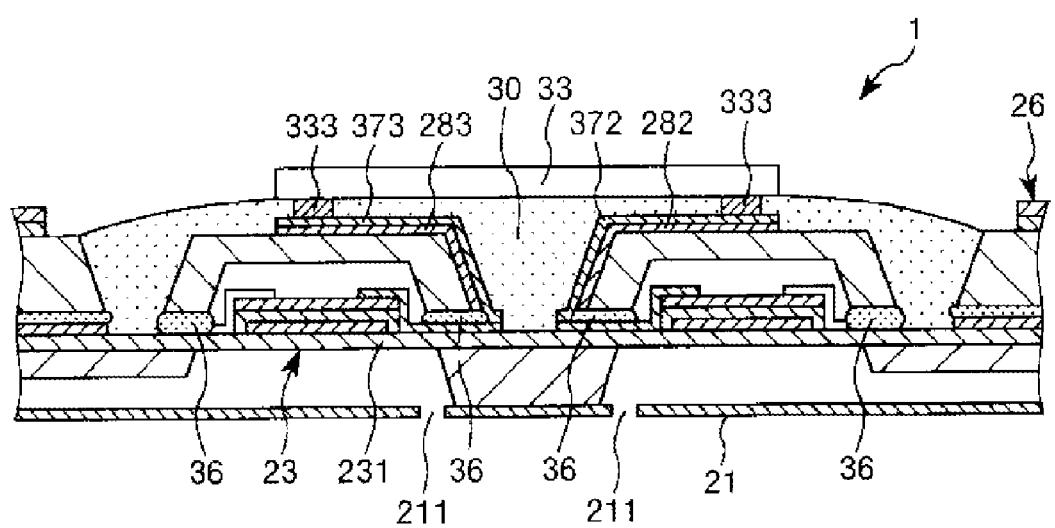
FIG. 14B is a sectional view illustrating a method of manufacturing the liquid droplet ejecting head shown in FIG. 10.

Next, the substrate 2200 and the elastic film 2310 are patterned in order by a photolithography technique and an etching technique, and thus, as shown in FIG. 13C, the vibrating plate 23 and the flow channel forming substrate 22 are obtained. Next, as shown in FIG. 14A, the nozzle substrate 21 is bonded to the lower surface of the flow channel forming substrate 22, and the compliance substrate 26 is bonded to the upper surface of the reservoir forming substrate 24. Next, the IC package 33 is prepared, and the IC package 33 is bonded to the reservoir forming substrate 24 through the terminals 333. Finally, as shown in FIG. 14B, the through portions 246a, 246b, and 246c are filled with the adhesive (filler) 30, whereby the liquid droplet ejecting head 1 is obtained.

According to the method of manufacturing the liquid droplet ejecting head 1, it is possible to form the reliable liquid droplet ejecting head 1.

Next, as an example of a liquid droplet ejecting apparatus according to the invention, the liquid droplet ejecting apparatus 100 having the above-described liquid droplet ejecting head 1 will be described.

Figure 15:
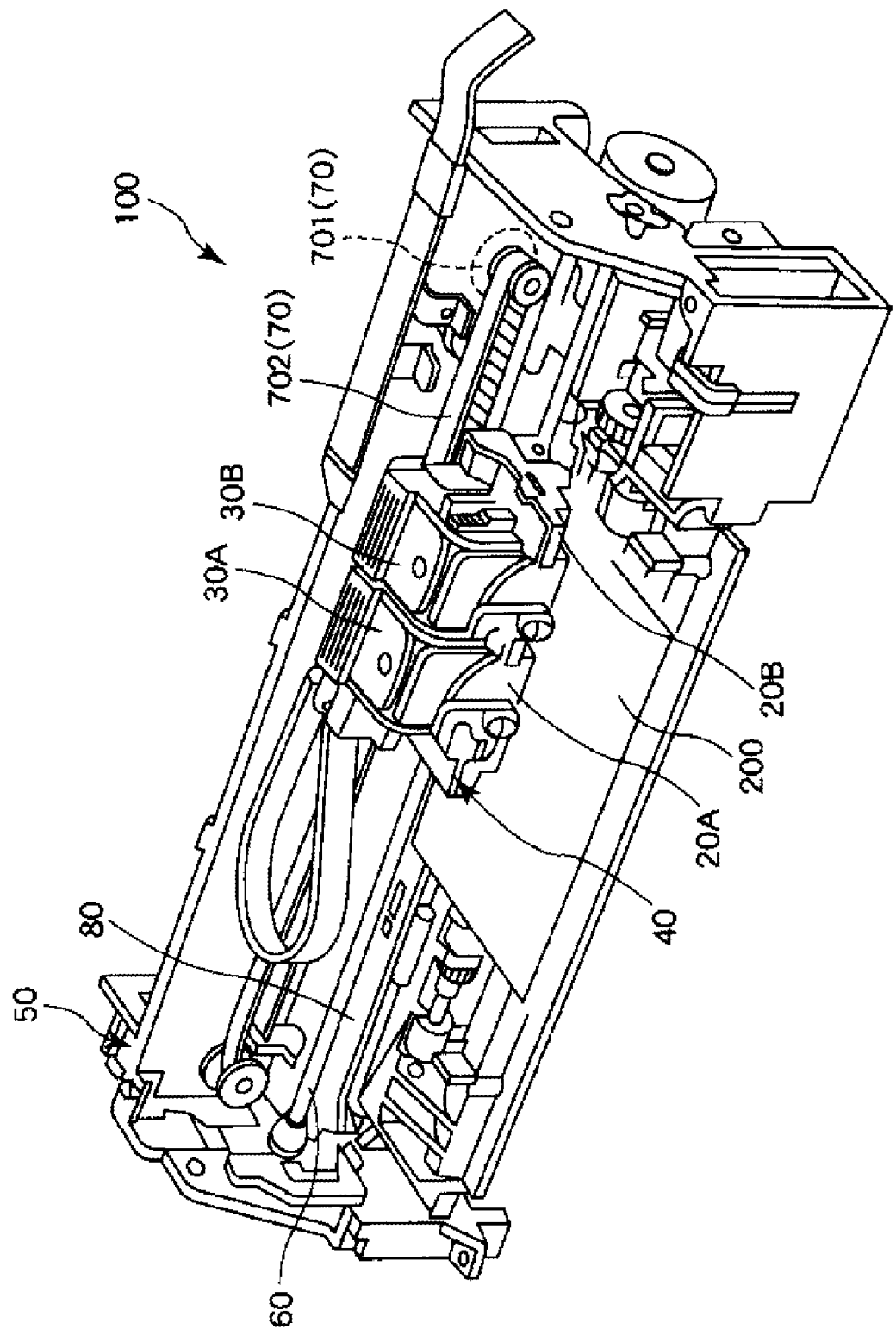
FIG. 15 is a perspective view showing an example of a liquid droplet ejecting apparatus according to an embodiment of the invention.

FIG. 15 is a perspective view showing an example of the liquid droplet ejecting apparatus according to the invention. The liquid droplet ejecting apparatus 100 (printing apparatus) shown in FIG. 15 is a printing apparatus which performs printing on a recording medium 200 in an ink jet system. The liquid droplet ejecting apparatus 100 includes an apparatus body 50, recording head units 20A and 20B with the liquid droplet ejecting head 1 mounted therein, ink cartridges 30A and 30B which supply the ink 300, a carriage 40 which transports the recording head units 20A and 20B, a moving mechanism 70 which moves the carriage 40, and a carriage shaft 60 which movably supports (guides) the carriage 40.

The ink cartridge 30A is detachably mounted in the recording head unit 20A, and in this mounting state, the ink 300 (black ink composition) can be supplied to the recording head unit 20A.

The ink cartridge 30B is detachably mounted in the recording head unit 20B, and in this mounting state, the ink 300 (color ink composition) can be supplied to the recording head unit 20B.

The moving mechanism 70 has a drive motor 701 and a timing belt 702 connected to the drive motor 701. Then, a driving force (rotational force) of the drive motor 701 is transmitted to the carriage 40 through the timing belt 702, whereby the carriage 40 can be moved along the carriage shaft 60 along with the recording head units 20A and 20B.

The apparatus body 50 is provided with a platen 80 along the axial direction below the carriage shaft 60. The recording medium 200 fed by a sheet feed roller (not shown) is transported on the platen 80. Then, the ink 300 is ejected on the recording medium 200 on the platen 80, and printing is executed.

Although the wiring structure, the method of manufacturing a wiring structure, the liquid droplet ejecting head, and the liquid droplet ejecting apparatus according to the invention have been described in connection with the embodiments shown in the drawings, the invention is not limited to the embodiments, and the respective portions which constitute the wiring structure, the liquid droplet ejecting head, and the liquid droplet ejecting apparatus can be replaced with arbitrary configurations having the same functions. Arbitrary components may be appended.

In the above-described embodiments, although an example where the wiring structure according to the invention is applied to a liquid droplet ejecting head has been described, the wiring structure according to the invention is not limited thereto, and the invention may be applied to various wiring structures insofar as a plurality of terminals on a base substrate and a plurality of wirings on the lateral surfaces of a wiring substrate bonded to the base substrate are electrically connected together.

In the above-described embodiments, an example where a liquid droplet ejecting apparatus ejects ink as liquid droplets on a recording medium, such as a printing sheet, to execute printing has been described, the liquid droplet ejecting apparatus according to the invention is not limited thereto, and for example, a liquid droplet ejecting apparatus may eject a liquid crystal display device forming material as liquid droplets to manufacture a liquid crystal display device (liquid crystal display), may eject an organic EL forming material as liquid droplets to manufacture an organic EL display device (organic EL device), or may eject a wiring pattern forming material as liquid droplets and may form a wiring pattern of an electronic circuit to manufacture a circuit board.

The entire disclosure of Japanese Patent Application No. 2013-035506 filed on Feb. 26, 2013 is expressly incorporated by reference herein.

The invention claimed is:

1. A method of manufacturing a liquid droplet ejecting head, the method comprising:
   preparing a base substrate, the base substrate being configured by:
      forming a first terminal group having a first terminal and a second terminal arranged in a predetermined direction and a second terminal group provided parallel to the first terminal group and having a third terminal and a fourth terminal arranged in the predetermined direction;
   preparing a wiring substrate, the wiring substrate being configured with:
      a first wiring forming portion having a first inclined surface and a second inclined surface at an acute angle with respect to the base substrate, the first wiring forming portion having first top and first bottom surfaces; and
      a second wiring forming portion having a third inclined surface and a fourth inclined surface at an acute angle with respect to the base substrate, the second wiring forming portion having second top and bottom surfaces,
      wherein the first and second inclined surfaces being formed between the first to surface and the first bottom surface and the third and fourth inclined surfaces being formed between the second top surface and the second bottom surface;

bonding the first and second bottom surfaces of the first and second wiring forming portions to the base substrate so as to place the first terminal in an exposed state from the first inclined surface, place the second terminal in an exposed state from the second inclined surface, the third terminal in an exposed state from the third inclined surface, and place the fourth terminal in an exposed state from the fourth inclined;

forming a first wiring on the first inclined surface and the first to surface to be directly and electrically connected to the first terminal, forming a second wiring on the second inclined surface and the first top surface to be directly and electrically connected to the second terminal, forming a third wiring on the third inclined surface and the second to surface to be directly and electrically connected to the third terminal, and forming a fourth wiring on the fourth inclined surface and the second top surface to be directly and electrically connected to the fourth terminal; and directly bonding an electronic circuit to the first through fourth wirings on the first and second top surfaces of the first and second wiring forming portions via a plurality of circuit terminals so that the first through fourth wirings are electrically connected to the plurality of circuit terminals.

2. A method of manufacturing a liquid droplet ejecting head, the method comprising:

preparing a base substrate, the base substrate being configured by:

forming a first terminal group having a first terminal and a second terminal arranged in a predetermined direction and a second terminal group provided parallel to the first terminal group and having a third terminal and a fourth terminal arranged in the predetermined direction;

preparing a wiring substrate, the wiring substrate being configured with:

a first wiring forming portion having a first inclined surface and a second inclined surface at an acute angle with respect to the base substrate, the first wiring forming portion having first top and first bottom surfaces; and a second wiring forming portion having a third inclined surface and a fourth inclined surface at an acute angle with respect to the base substrate, the second wiring forming portion having second top and second bottom surfaces;

a first wiring being formed on the first inclined surface and the first top surface, a second wiring being formed on the second inclined surface and the first top surface, a third wiring being formed on the third inclined surface and the second top surface, and a fourth wiring being formed on the fourth inclined surface and the second top surface;

wherein the first and second inclined surfaces being formed between the first to surface and the first bottom surface, the third and fourth inclined surfaces being formed between the second top surface and the second bottom surface;

bonding the first and second bottom surfaces of the first and second wiring forming portions to the base substrate so as to place the first terminal in an exposed state from the first inclined surface, place the second terminal in an exposed state from the second inclined surface, the third terminal in an exposed state from the third inclined surface, and place the fourth terminal in an exposed state from the fourth inclined surface;

directly and electrically connecting the first wiring and the first terminal, the second wiring and the second terminal, the third wiring and the third terminal, and the fourth wiring and the fourth terminal through conductive connecting members; and directly bonding an electronic circuit to the first through wirings on the first and second top surfaces of the first and second wiring forming portions via a plurality of circuit terminals so that the first through fourth wirings are electrically connected to the plurality of circuit terminals.

3. A liquid droplet ejecting head comprising:

a base substrate on which a first terminal group having a first terminal and a second terminal arranged in a predetermined direction and a second terminal group provided parallel to the first terminal group and having a third terminal and a fourth terminal arranged in the predetermined direction are formed;

a wiring substrate having:

a first wiring forming portion having a first inclined surface and a second inclined surface at an acute angle with respect to the base substrate, the first wiring forming portion having first top and first bottom surfaces; and a second wiring forming portion having a third inclined surface and a fourth inclined surface at an acute angle with respect to the base substrate, the second wiring forming portion having second top and second bottom surfaces, wherein the first and second inclined surfaces being formed between the first top surface and the first bottom surface, the third and fourth inclined surfaces being formed between the second top surface and the second bottom surface, the first and second top surfaces being bonded to an electronic circuit via a plurality of circuit terminals, and the first and second bottom surfaces are bonded to the base substrate;

a first wiring which is formed on the first inclined surface and the first top surface, and is directly and electrically connected to the first terminal;

a second wiring which is formed on the second inclined surface and the first top surface, and is directly and electrically connected to the second terminal;

a third wiring which is formed on the third inclined surface and the second top surface, and is directly and electrically connected to the third terminal; and a fourth wiring which is formed on the fourth inclined surface and the second top surface, and is directly and electrically connected to the fourth terminal, wherein the first through fourth wirings are electrically connected to the plurality of circuit terminals, and wherein the first through fourth wirings on the first and second top surfaces of the first and second wiring forming portions, the plurality of the circuit terminals, and the electronic circuit are directly stacked on each other.

4. The liquid droplet ejecting head according to claim 3, wherein a fifth terminal which is electrically connected to the first wiring and a sixth terminal which is electrically connected to the second wiring are formed on the first top surface, a seventh terminal which is electrically connected to the third wiring and an eighth terminal which is electrically connected to the fourth wiring are formed on the second top surface, and wherein the fifth through eighth terminals are physically and electrically connected to the plurality of circuit terminals.

5. The liquid droplet ejecting head according to claim 3, wherein a plurality of first terminals and a plurality of second terminals are alternately arranged in parallel, and a plurality of third terminals and a plurality of fourth terminals are alternately formed in parallel.

6. The liquid droplet ejecting head according to claim 3, wherein one end of the first wiring is formed to overlap the first terminal, one end of the second wiring is formed to overlap the second terminal, one end of the third wiring is formed to overlap the third terminal, and one end of the fourth wiring is formed to overlap the fourth terminal.

7. The liquid droplet ejecting head according to claim 3, wherein the first wiring and the first terminal, the second wiring and the second terminal, the third wiring and the third terminal, and the fourth wiring and the fourth terminal are respectively electrically connected through conductive connecting members.

8. The liquid droplet ejecting head according to claim 3, wherein the wiring substrate is bonded to the base substrate by an insulating adhesive.

9. The liquid droplet ejecting head according to claim 3, wherein the wiring substrate is made of silicon, and the first inclined surface, the second inclined surface, the third inclined surface, and the fourth inclined surface are formed along the crystal plane of silicon.

10. A liquid droplet ejecting apparatus comprising:
the liquid droplet ejecting head according to claim 3.

* * * * *